United States Patent
Knight et al.

(10) Patent No.: US 7,467,853 B2
(45) Date of Patent: *Dec. 23, 2008

(54) CRADLE FOR PRINTHEAD CARTRIDGE HAVING POWER REGULATION INTERFACE

(75) Inventors: Paul Charles Knight, Balmain (AU); Kia Silverbrook, Balmain (AU); Bruce Mervyn Horsburgh, Balmain (AU); Saminda Jayatileke, Balmain (AU); Brian Robert Brown, Balmain (AU)

(73) Assignee: Silverbrook Research Pty Ltd, Balmain, New South Wales (AU)

( * ) Notice: Subject to any disclaimer, the term of this patent is extended or adjusted under 35 U.S.C. 154(b) by 392 days.

This patent is subject to a terminal disclaimer.

(21) Appl. No.: 11/293,839

(22) Filed: Dec. 5, 2005

(65) Prior Publication Data

US 2007/0126808 A1   Jun. 7, 2007

(51) Int. Cl.
*B41J 2/14* (2006.01)
(52) U.S. Cl. ....................................................... 347/49
(58) Field of Classification Search .................. 347/5, 347/9, 19, 37, 49, 50, 58
See application file for complete search history.

(56) References Cited

U.S. PATENT DOCUMENTS

| 5,692,108 | A  | * | 11/1997 | Donahue ................ 358/1.8 |
| 6,174,037 | B1 | * | 1/2001 | Donahue et al. ............ 347/9 |
| 6,199,969 | B1 | * | 3/2001 | Haflinger et al. .......... 347/19 |
| 6,796,626 | B2 | * | 9/2004 | Nishida ...................... 347/5 |
| 7,216,960 | B2 | * | 5/2007 | Imanaka et al. ............ 347/58 |
| 2002/0033964 | A1 | | 3/2002 | Hopkins |
| 2005/0062804 | A1 | | 3/2005 | Eaton |
| 2005/0088466 | A1 | | 4/2005 | Smith et al. |
| 2005/0134618 | A1 | | 6/2005 | Edelen et al. |
| 2005/0155077 | A1 | | 7/2005 | Silverbrook et al. |
| 2005/0264608 | A1 | | 12/2005 | Hirayama |

FOREIGN PATENT DOCUMENTS

EP  0592221  4/1994

* cited by examiner

*Primary Examiner*—Anh T. N. Vo

(57) ABSTRACT

A cradle unit for a printhead cartridge, the cradle unit comprising: an interface at which a printhead cartridge is removably engageable with the cradle unit, the interface comprising connections for connecting the printhead cartridge with a power supply which is remote from the interface; and a power regulation circuit incorporated in the interface for regulating supply of power from the power supply to the printhead cartridge.

16 Claims, 32 Drawing Sheets

CRADLE FOR PRINTHEAD CARTRIDGE HAVING POWER REGULATION INTERFACE

FIELD OF INVENTION

The present invention relates to a printer cradle unit having efficient interconnection with a printhead cartridge by the incorporation of power regulation within the interconnection.

CO-PENDING APPLICATIONS

The following applications have been filed by the Applicant simultaneously with the present application:

| | | | | | |
|---|---|---|---|---|---|
| 11/293800 | 11/293802 | 11/293801 | 11/293808 | 11/293809 | 11/293832 |
| 11/293838 | 11/293825 | 11/293841 | 11/293799 | 11/293796 | 11/293797 |
| 11/293798 | 11/293804 | 11/293840 | 11/293803 | 11/293833 | 11/293834 |
| 11/293835 | 11/293836 | 11/293837 | 11/293792 | 11/293794 | 11/293826 |
| 11/293829 | 11/293830 | 11/293827 | 11/293828 | 7270494 | 11/293823 |
| 11/293824 | 11/293831 | 11/293815 | 11/293819 | 11/293818 | 11/293817 |
| 11/293816 | 11/293820 | 11/293813 | 11/293822 | 11/293812 | 11/293821 |
| 11/293814 | 11/293793 | 11/293842 | 11/293811 | 11/293807 | 11/293806 |
| 11/293805 | 11/293810 | | | | |

The disclosures of these co-pending applications are incorporated herein by reference.

CROSS REFERENCES TO RELATED APPLICATIONS

Various methods, systems and apparatus relating to the present invention are disclosed in the following US Patents/Patent Applications filed by the applicant or assignee of the present invention:

| | | | | | |
|---|---|---|---|---|---|
| 6750901 | 6476863 | 6788336 | 7249108 | 6566858 | 6331946 |
| 6246970 | 6442525 | 7346586 | 09/505951 | 6374354 | 7246098 |
| 6816968 | 6757832 | 6334190 | 6745331 | 7249109 | 7197642 |
| 7093139 | 10/636263 | 10/636283 | 10/866608 | 7210038 | 10/902883 |
| 10/940653 | 10/942858 | 11/003786 | 7258417 | 7293853 | 7328968 |
| 7270395 | 11/003404 | 11/003419 | 7334864 | 7255419 | 7284819 |
| 7229148 | 7258416 | 7273263 | 7270393 | 6984017 | 7347526 |
| 11/071473 | 11/003463 | 11/003701 | 11/003683 | 11/003614 | 7284820 |
| 7341328 | 7246875 | 7322669 | 11/246676 | 11/246677 | 11/246678 |
| 11/246679 | 11/246680 | 11/246681 | 11/246714 | 11/246713 | 11/246689 |
| 11/246671 | 11/246704 | 11/246710 | 11/246688 | 11/246716 | 11/246715 |
| 11/246707 | 11/246706 | 11/246705 | 11/246708 | 11/246693 | 11/246692 |
| 11/246696 | 11/246695 | 11/246694 | 10/922842 | 10/922848 | 6623101 |
| 6406129 | 6505916 | 6457809 | 6550895 | 6457812 | 7152962 |
| 6428133 | 7204941 | 7282164 | 10/815628 | 7278727 | 10/913373 |
| 10/913374 | 10/913372 | 7138391 | 7153956 | 10/913380 | 10/913379 |
| 10/913376 | 7122076 | 7148345 | 11/172816 | 11/172815 | 11/172814 |
| 10/407212 | 7252366 | 10/683064 | 10/683041 | 6746105 | 11/246687 |
| 11/246718 | 7322681 | 11/246686 | 11/246703 | 11/246691 | 11/246711 |
| 11/246690 | 11/246712 | 11/246717 | 11/246709 | 11/246700 | 11/246701 |
| 11/246702 | 11/246668 | 11/246697 | 11/246698 | 11/246699 | 11/246675 |
| 11/246674 | 11/246667 | 7156508 | 7159972 | 7083271 | 7165834 |
| 7080894 | 7201469 | 7090336 | 7156489 | 10/760233 | 10/760246 |
| 7083257 | 7258422 | 7255423 | 7219980 | 10/760253 | 10/760255 |
| 10/760209 | 7118192 | 10/760194 | 7322672 | 7077505 | 7198354 |
| 7077504 | 10/760189 | 7198355 | 10/760232 | 7322676 | 7152959 |
| 7213906 | 7178901 | 7222938 | 7108353 | 7104629 | 7303930 |
| 11/246672 | 11/246673 | 11/246683 | 11/246682 | 7246886 | 7128400 |
| 7108355 | 6991322 | 7287836 | 7118197 | 10/728784 | 10/728783 |
| 7077493 | 6962402 | 10/728803 | 7147308 | 10/728779 | 7118198 |
| 7168790 | 7172270 | 7229155 | 6830318 | 7195342 | 7175261 |
| 10/773183 | 7108356 | 7118202 | 10/773186 | 7134744 | 10/773185 |
| 7134743 | 7182439 | 7210768 | 10/773187 | 7134745 | 7156484 |
| 7118201 | 7111926 | 10/773184 | 7018021 | 11/060751 | 11/060805 |
| 11/188017 | 11/097308 | 11/097309 | 7246876 | 11/097299 | 11/097310 |
| 11/097213 | 7328978 | 7334876 | 7147306 | 09/575197 | 7079712 |
| 6825945 | 7330974 | 6813039 | 6987506 | 7038797 | 6980318 |
| 6816274 | 7102772 | 7350236 | 6681045 | 6728000 | 7173722 |
| 7088459 | 09/575181 | 7068382 | 7062651 | 6789194 | 6789191 |
| 6644642 | 6502614 | 6622999 | 6669385 | 6549935 | 6987573 |
| 6727996 | 6591884 | 6439706 | 6760119 | 7295332 | 6290349 |
| 6428155 | 6785016 | 6870966 | 6822639 | 6737591 | 7055739 |
| 7233320 | 6830196 | 6832717 | 6957768 | 09/575172 | 7170499 |
| 7106888 | 7123239 | 10/727181 | 10/727162 | 10/727163 | 10/727245 |
| 7121639 | 7165824 | 7152942 | 10/727157 | 7181572 | 7096137 |
| 7302592 | 7278034 | 7188282 | 10/727159 | 10/727180 | 10/727179 |
| 10/727192 | 10/727274 | 10/727164 | 10/727161 | 10/727198 | 10/727158 |
| 10/754536 | 10/754938 | 10/727160 | 10/934720 | 7171323 | 7278697 |
| 10/296522 | 6795215 | 7070098 | 7154638 | 6805419 | 6859289 |
| 6977751 | 6398332 | 6394573 | 6622923 | 6747760 | 6921144 |
| 10/884881 | 7092112 | 7192106 | 11/039866 | 7173739 | 6986560 |
| 7008033 | 11/148237 | 7222780 | 7270391 | 7195328 | 7182422 |
| 10/854521 | 10/854522 | 10/854488 | 7281330 | 10/854503 | 7328956 |
| 10/854509 | 7188928 | 7093989 | 10/854497 | 10/854495 | 10/854498 |
| 10/854511 | 10/854512 | 10/854525 | 10/854526 | 10/854516 | 7252353 |
| 10/854515 | 7267417 | 10/854505 | 10/854493 | 7275805 | 7314261 |
| 10/854490 | 7281777 | 7290852 | 10/854528 | 10/854523 | 10/854527 |
| 10/854524 | 10/854520 | 10/854514 | 10/854519 | 10/854513 | 10/854499 |
| 10/854501 | 7266661 | 7243193 | 10/854518 | 10/854517 | 10/934628 |
| 7163345 | 10/760254 | 10/760210 | 10/760202 | 7201468 | 10/760198 |
| 10/760249 | 7234802 | 7303255 | 7287846 | 7156511 | 10/760264 |
| 7258432 | 7097291 | 10/760222 | 10/760248 | 7083273 | 10/760192 |
| 10/760203 | 10/760201 | 10/760205 | 10/760206 | 10/760267 | 10/760270 |
| 7198352 | 10/760271 | 7303251 | 7201470 | 7121655 | 7293861 |
| 7232208 | 7328985 | 7344232 | 7083272 | 11/014764 | 11/014763 |
| 7331663 | 11/014747 | 7328973 | 11/014760 | 11/014757 | 7303252 |
| 7249822 | 11/014762 | 7311382 | 11/014723 | 11/014756 | 11/014736 |
| 7350896 | 11/014758 | 11/014725 | 7331660 | 11/014738 | 11/014737 |
| 7322684 | 7322685 | 7311381 | 7270405 | 7303268 | 11/014735 |
| 11/014734 | 11/014719 | 11/014750 | 11/014749 | 7249833 | 11/014769 |
| 11/014729 | 7331661 | 11/014733 | 7300140 | 11/014755 | 11/014765 |
| 11/014766 | 11/014740 | 7284816 | 7284845 | 7255430 | 11/014744 |
| 7328984 | 7350913 | 7322671 | 11/014718 | 11/014717 | 11/014716 |
| 11/014732 | 7347534 | 11/097268 | 11/097185 | 11/097184 | |

The disclosures of these applications and patents are incorporated herein by reference.

BACKGROUND OF INVENTION

Known cradle support units for printhead cartridges have complex print control circuitry. This complexity results from the integration of all circuitry needed for the printhead cartridge on the print control circuitry board. Increased circuit complexity increases the amount of space used, which makes it difficult to obtain a compact cradle and cartridge arrangement.

SUMMARY OF INVENTION

In a first aspect the present invention provides a system for interconnecting a printhead cartridge and a cradle unit for supporting the printhead cartridge, the system comprising:
an interface at which the printhead cartridge is removably engageable with the cradle unit, the interface comprising connections for connecting the printhead cartridge with a power supply of the cradle unit; and
a power regulation circuit incorporated in the interface for regulating supply of power from the power supply to the printhead cartridge.

Optionally, the power regulation circuit is configured to regulate the supply of power from the power supply so that ink ejection nozzles of a printhead incorporated in the printhead cartridge receive substantially constant power.

Optionally, the interface incorporates a printed circuit board, the connections and power regulation circuit being arranged on the printed circuit board.

Optionally, the connections of the interface are arranged to connect the printhead cartridge with print control circuitry of the cradle unit.

Optionally, the print control circuitry is incorporated on a second printed circuit board, the first and second printed circuit boards having complementary connectors which cooperate to provide the connection of the printhead cartridge and print control circuitry.

Optionally, the first printed circuit board is arranged so as to substantially orthogonally project from the second printed circuit through the cooperation of the complementary connectors.

Optionally, the complementary connectors are arranged so that the first printed circuit board is able to pivot with respect to the second printed circuit board.

Optionally, the power regulation circuit is configured to output a regulated voltage up to 5.5 Volts from a supply of 12 Volts from the power supply.

Optionally, the power regulation circuit is configured to output a regulated current of 3.5 Amps from a supply of 2 Amps from the power supply.

Optionally, the power regulation circuit is configured to output the regulated voltage with a maximum variation of 100 milliVolts.

Optionally, the power regulation circuit incorporates a power storage circuit for storing at least some of the power being supplied to the printhead cartridge from the power supply.

Optionally, the power storage circuit includes a plurality of capacitors for storing said power.

Optionally, the capacitors include electrolytic and ceramic capacitors.

Optionally, the electrolytic capacitors are 100 microFarad capacitors.

Optionally, the electrolytic capacitors are tantalum capacitors.

Optionally, eight of the electrolytic capacitors are arranged in parallel to store about 12 milliJoules of energy.

Optionally, the ceramic capacitors are 10 microFarad capacitors.

Optionally, six of the ceramic capacitors are arranged in parallel to store about 900 microJoules of energy.

Optionally, the power storage circuit further includes an inductor for storing some of said power.

Optionally, the inductor is a 10 microHenry inductor.

In a second aspect the present invention provides a cradle unit for a printhead cartridge, the cradle unit comprising:
  an interface at which a printhead cartridge is removably engageable with the cradle unit, the interface comprising connections for connecting the printhead cartridge with a power supply which is remote from the interface; and
  a power regulation circuit incorporated in the interface for regulating supply of power from the power supply to the printhead cartridge.

Optionally, the power regulation circuit is configured to regulate the supply of power from the power supply so that ink ejection nozzles of a printhead incorporated in the printhead cartridge receive substantially constant power.

Optionally, the interface incorporates a printed circuit board, the connections and power regulation circuit being arranged on the printed circuit board.

Optionally, the connections of the interface are arranged to connect the printhead cartridge with a print control circuitry of the cradle unit.

Optionally, the print control circuitry is incorporated on a second printed circuit board, the first and second printed circuit boards having complementary connectors which cooperate to provide the connection of the printhead cartridge and print control circuitry.

Optionally, the first printed circuit board is arranged so as to substantially orthogonally project from the second printed circuit through the cooperation of the complementary connectors.

Optionally, the complementary connectors are arranged so that the first printed circuit board is able to pivot with respect to the second printed circuit board.

Optionally, the power regulation circuit is configured to output a regulated voltage up to 5.5 Volts from a supply of 12 Volts from the power supply.

Optionally, the power regulation circuit is configured to output a regulated current of 3.5 Amps from a supply of 2 Amps from the power supply.

Optionally, the power regulation circuit is configured to output the regulated voltage with a maximum variation of 100 milliVolts.

Optionally, the power regulation circuit incorporates a power storage circuit for storing at least some of the power being supplied to the printhead cartridge from the power supply.

Optionally, the power storage circuit includes a plurality of capacitors for storing said power.

Optionally, the capacitors include electrolytic and ceramic capacitors.

Optionally, the electrolytic capacitors are 100 microFarad capacitors.

Optionally, the electrolytic capacitors are tantalum capacitors.

Optionally, eight of the electrolytic capacitors are arranged in parallel to store about 12 milliJoules of energy.

Optionally, the ceramic capacitors are 10 microFarad capacitors.

Optionally, six of the ceramic capacitors are arranged in parallel to store about 900 microJoules of energy.

Optionally, the power storage circuit further includes an inductor for storing some of said power.

Optionally, the inductor is a 10 microHenry inductor.

In a third aspect the present invention provides a printing system comprising:
  a printhead cartridge comprising a printhead;
  a cradle unit for supporting the printhead cartridge; and
  an interface at which the cradle unit is removably engageable with the printhead cartridge, the interface comprising connections for connecting the printhead cartridge with a power supply which is remote from the interface and a power regulation circuit for regulating supply of power from the power supply to the printhead cartridge.

Optionally, the power regulation circuit is configured to regulate the supply of power from the power supply so that ink ejection nozzles of a printhead incorporated in the printhead cartridge receive substantially constant power.

Optionally, the interface incorporates a printed circuit board, the connections and power regulation circuit being arranged on the printed circuit board.

Optionally, the connections of the interface are arranged to connect the printhead cartridge with a print control circuitry of the cradle unit.

Optionally, the print control circuitry is incorporated on a second printed circuit board, the first and second printed circuit boards having complementary connectors which cooperate to provide the connection of the printhead cartridge and print control circuitry.

Optionally, the first printed circuit board is arranged so as to substantially orthogonally project from the second printed circuit through the cooperation of the complementary connectors.

Optionally, the complementary connectors are arranged so that the first printed circuit board is able to pivot with respect to the second printed circuit board.

Optionally, the power regulation circuit is configured to output a regulated voltage up to 5.5 Volts from a supply of 12 Volts from the power supply.

Optionally, the power regulation circuit is configured to output a regulated current of 3.5 Amps from a supply of 2 Amps from the power supply.

Optionally, the power regulation circuit is configured to output the regulated voltage with a maximum variation of 100 millivolts.

Optionally, the power regulation circuit incorporates a power storage circuit for storing at least some of the power being supplied to the printhead cartridge from the power supply.

Optionally, the power storage circuit includes a plurality of capacitors for storing said power.

Optionally, the capacitors include electrolytic and ceramic capacitors.

Optionally, the electrolytic capacitors are 100 microFarad capacitors.

Optionally, the electrolytic capacitors are tantalum capacitors.

Optionally, eight of the electrolytic capacitors are arranged in parallel to store about 12 milliJoules of energy.

Optionally, the ceramic capacitors are 10 microFarad capacitors.

Optionally, six of the ceramic capacitors are arranged in parallel to store about 900 microJoules of energy.

Optionally, the power storage circuit further includes an inductor for storing some of said power.

Optionally, the inductor is a 10 microHenry inductor.

In a fourth aspect the present invention provides a system for interconnecting a printhead cartridge and a cradle unit for supporting the printhead cartridge, the system comprising:
  an interface at which the printhead cartridge is removably engageable with the cradle unit, the interface comprising connections for connecting the printhead cartridge with a power supply of the cradle unit; and
  a power storage circuit incorporated in the interface for storing at least some of the power being supplied to the printhead cartridge from the power supply.

Optionally, the interface incorporates a printed circuit board, the connections and power storage circuit being arranged on the printed circuit board.

Optionally, the connections of the interface are arranged to connect the printhead cartridge with print control circuitry of the cradle unit.

Optionally, the print control circuitry is incorporated on a second printed circuit board, the first and second printed circuit boards having complementary connectors which cooperate to provide the connection of the printhead cartridge and print control circuitry.

Optionally, the first printed circuit board is arranged so as to substantially orthogonally project from the second printed circuit through the cooperation of the complementary connectors.

Optionally, the complementary connectors are arranged so that the first printed circuit board is able to pivot with respect to the second printed circuit board.

Optionally, the power storage circuit includes a plurality of capacitors for storing said power.

Optionally, the capacitors include electrolytic and ceramic capacitors.

Optionally, the electrolytic capacitors are 100 microFarad capacitors.

Optionally, the electrolytic capacitors are tantalum capacitors.

Optionally, eight of the electrolytic capacitors are arranged in parallel to store about 12 milliJoules of energy.

Optionally, the ceramic capacitors are 10 microFarad capacitors.

Optionally, six of the ceramic capacitors are arranged in parallel to store about 900 microJoules of energy.

Optionally, the power storage circuit further includes an inductor for storing some of said power.

Optionally, the inductor is a 10 microHenry inductor.

Optionally, the power storage circuit is incorporated in a power regulation circuit of the interface, the power regulation circuit being configured to regulate the supply of power from the power supply to the printhead cartridge.

Optionally, the power regulation circuit is configured to regulate the supply of power from the power supply so that ink ejection nozzles of a printhead incorporated in the printhead cartridge receive substantially constant power.

Optionally, the power regulation circuit is configured to output a regulated voltage up to 5.5 Volts from a supply of 12 Volts from the power supply.

Optionally, the power regulation circuit is configured to output a regulated current of 3.5 Amps from a supply of 2 Amps from the power supply.

Optionally, the power regulation circuit is configured to output the regulated voltage with a maximum variation of 100 millivolts.

In a fifth aspect the present invention provides a cradle unit for a printhead cartridge, the cradle unit comprising:
  an interface at which the cradle unit is removably engageable with a printhead cartridge, the interface comprising connections for connecting the printhead cartridge with a power supply which is remote from the interface; and
  a power storage circuit incorporated in the interface for storing at least some of the power being supplied to the printhead cartridge from the power supply.

Optionally, the interface incorporates a printed circuit board, the connections and power storage circuit being arranged on the printed circuit board.

Optionally, the connections of the interface are arranged to connect the printhead cartridge with print control circuitry of the cradle unit.

Optionally, the print control circuitry is incorporated on a second printed circuit board, the first and second printed circuit boards having complementary connectors which cooperate to provide the connection of the printhead cartridge and print control circuitry.

Optionally, the first printed circuit board is arranged so as to substantially orthogonally project from the second printed circuit through the cooperation of the complementary connectors.

Optionally, the complementary connectors are arranged so that the first printed circuit board is able to pivot with respect to the second printed circuit board.

Optionally, the power storage circuit includes a plurality of capacitors for storing said power.

Optionally, the capacitors include electrolytic and ceramic capacitors.

Optionally, the electrolytic capacitors are 100 microFarad capacitors.

Optionally, the electrolytic capacitors are tantalum capacitors.

Optionally, eight of the electrolytic capacitors are arranged in parallel to store about 12 milliJoules of energy.

Optionally, the ceramic capacitors are 10 microFarad capacitors.

Optionally, six of the ceramic capacitors are arranged in parallel to store about 900 microJoules of energy.

Optionally, the power storage circuit further includes an inductor for storing some of said power.

Optionally, the inductor is a 10 microHenry inductor.

Optionally, the power storage circuit is incorporated in a power regulation circuit of the interface, the power regulation circuit being configured to regulate the supply of power from the power supply to the printhead cartridge.

Optionally, the power regulation circuit is configured to regulate the supply of power from the power supply so that ink ejection nozzles of a printhead incorporated in the printhead cartridge receive substantially constant power.

Optionally, the power regulation circuit is configured to output a regulated voltage up to 5.5 Volts from a supply of 12 Volts from the power supply.

Optionally, the power regulation circuit is configured to output a regulated current of 3.5 Amps from a supply of 2 Amps from the power supply.

Optionally, the power regulation circuit is configured to output the regulated voltage with a maximum variation of 100 millivolts.

In a sixth aspect the present invention provides a printing system comprising:
  a printhead cartridge comprising a printhead;
  a cradle unit for supporting the printhead cartridge; and
  an interface at which the cradle unit is removably engageable with the printhead cartridge, the interface comprising connections for connecting the printhead cartridge with a power supply which is remote from the interface and a power storage circuit for storing at least some of the power being supplied to the printhead cartridge from the power supply.

Optionally, the interface incorporates a printed circuit board, the connections and power storage circuit being arranged on the printed circuit board.

Optionally, the connections of the interface are arranged to connect the printhead cartridge with print control circuitry of the cradle unit.

Optionally, the print control circuitry is incorporated on a second printed circuit board, the first and second printed circuit boards having complementary connectors which cooperate to provide the connection of the printhead cartridge and print control circuitry.

printed circuit through the cooperation of the complementary connectors.

Optionally, the complementary connectors are arranged so that the first printed circuit board is able to pivot with respect to the second printed circuit board.

Optionally, the power storage circuit includes a plurality of capacitors for storing said power.

Optionally, the capacitors include electrolytic and ceramic capacitors.

Optionally, the electrolytic capacitors are 100 microFarad capacitors.

Optionally, the electrolytic capacitors are tantalum capacitors.

Optionally, eight of the electrolytic capacitors are arranged in parallel to store about 12 milliJoules of energy.

Optionally, the ceramic capacitors are 10 microFarad capacitors.

Optionally, six of the ceramic capacitors are arranged in parallel to store about 900 microJoules of energy.

Optionally, the power storage circuit further includes an inductor for storing some of said power.

Optionally, the inductor is a 10 microHenry inductor.

Optionally, the power storage circuit is incorporated in a power regulation circuit of the interface, the power regulation circuit being configured to regulate the supply of power from the power supply to the printhead cartridge.

Optionally, the power regulation circuit is configured to regulate the supply of power from the power supply so that ink ejection nozzles of a printhead incorporated in the printhead cartridge receive substantially constant power.

Optionally, the power regulation circuit is configured to output a regulated voltage up to 5.5 Volts from a supply of 12 Volts from the power supply.

Optionally, the power regulation circuit is configured to output a regulated current of 3.5 Amps from a supply of 2 Amps from the power supply.

Optionally, the power regulation circuit is configured to output the regulated voltage with a maximum variation of 100 milliVolts.

An embodiment of a printer and cradle unit that incorporates features of the present invention is now described by way of example with reference to the accompanying drawings.

DETAILED DESCRIPTION OF EMBODIMENTS

Figure 1:
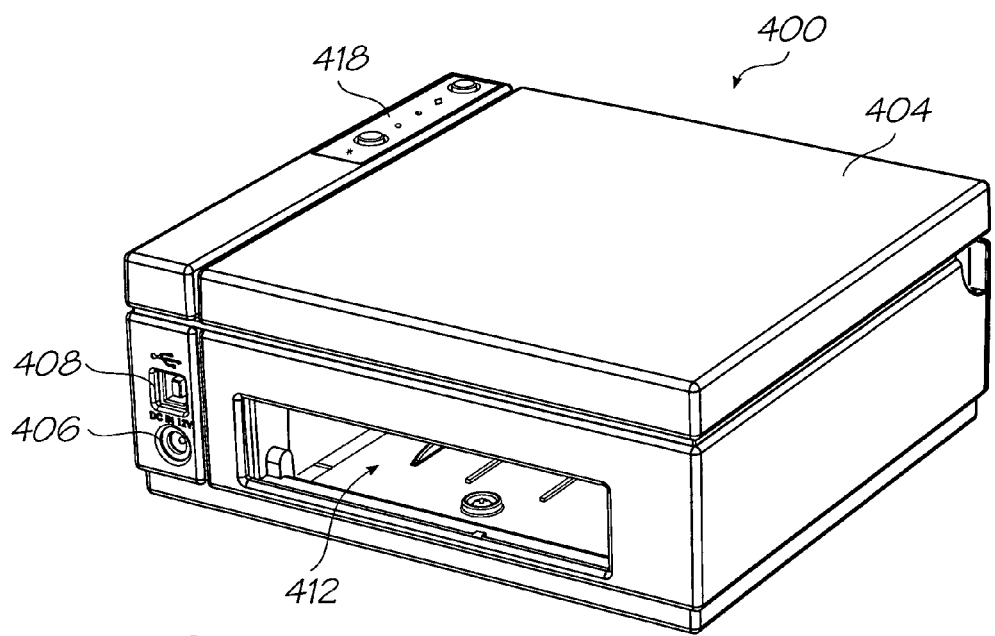
FIG. 1 shows a perspective view of a cradle unit of a printer.
Figure 2:
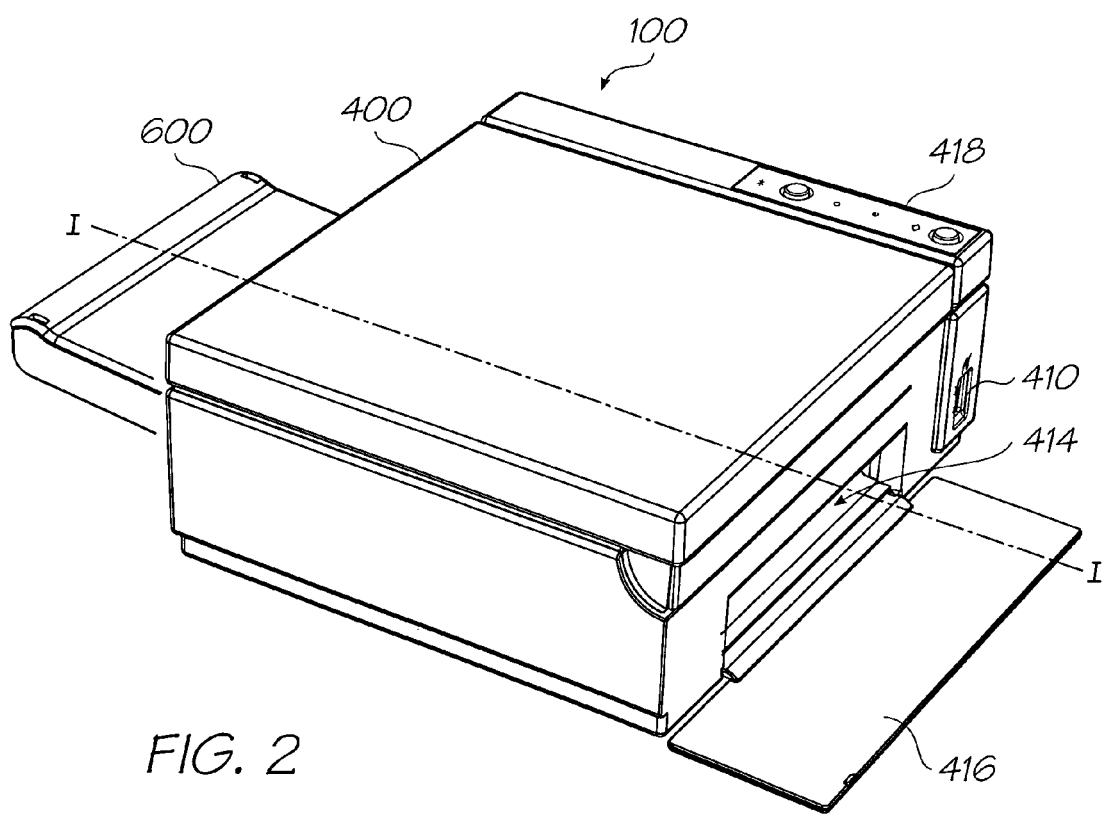
FIG. 2 shows a perspective view of the printer.
Figure 3A:
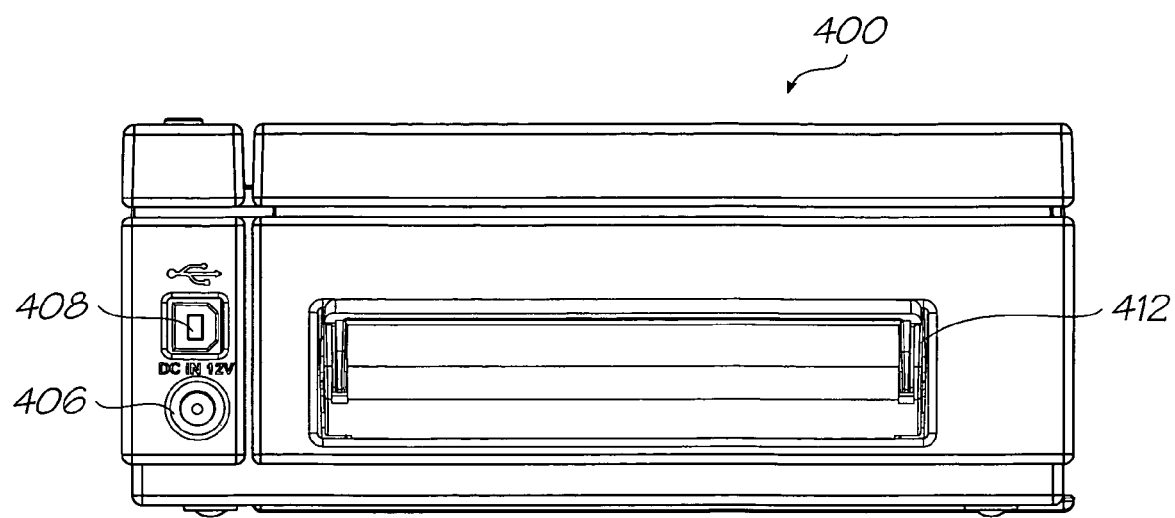
FIGS. 3A and 3B respectively show opposite side views of the cradle unit.
Figure 3B:
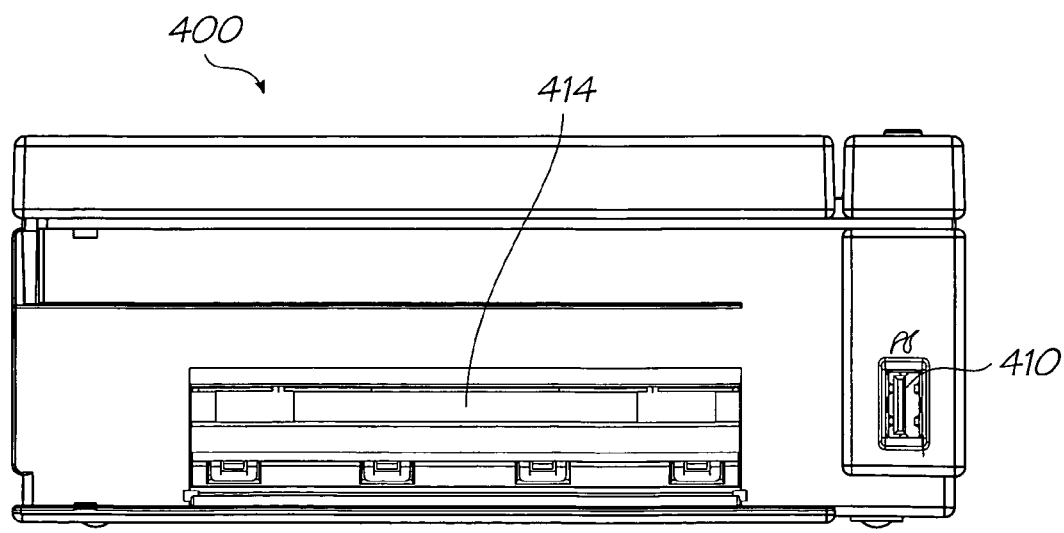
Figure 4:
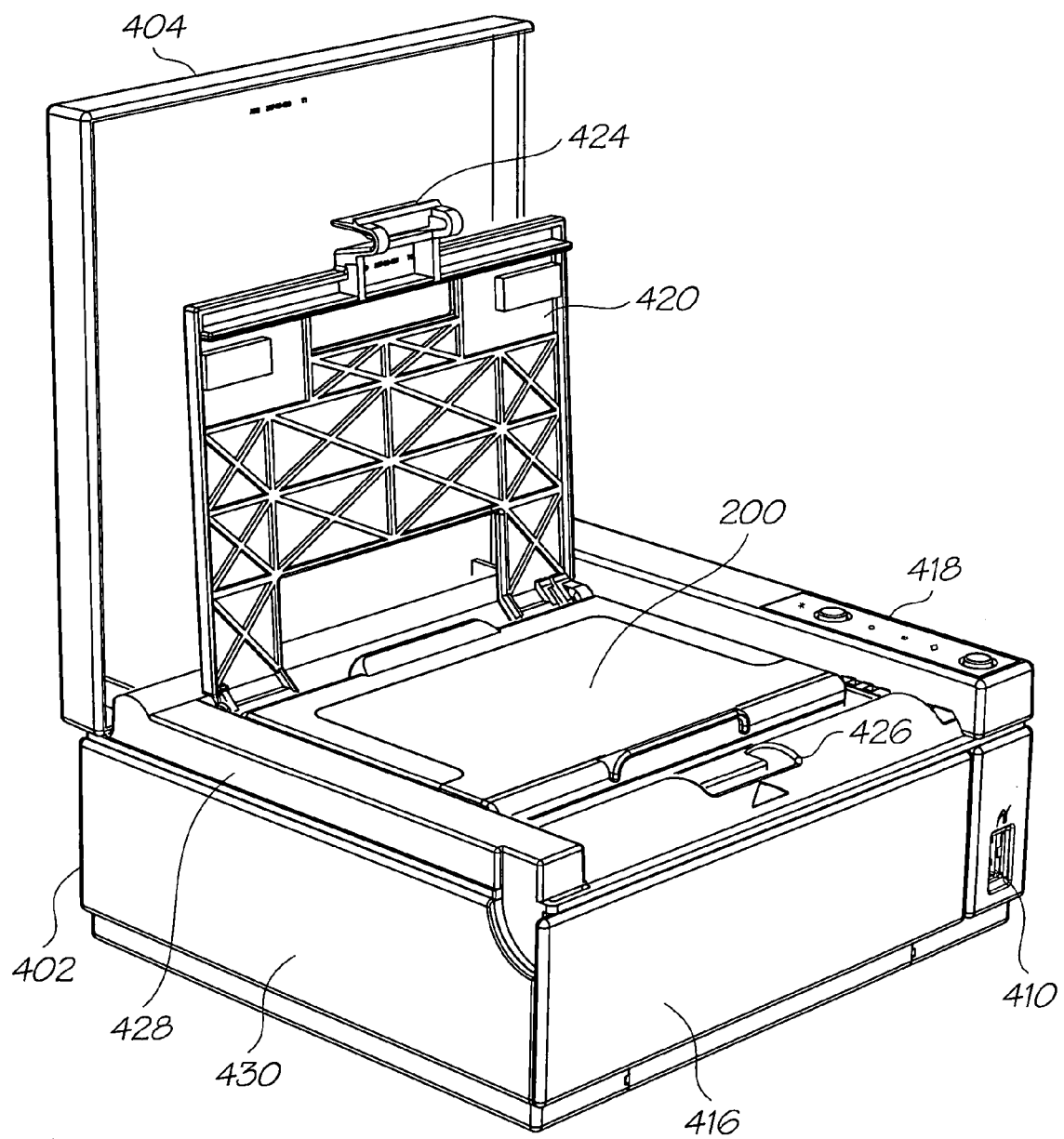
FIG. 4 illustrates an inserted state of a printhead cartridge in the cradle unit.

A printer 100 is variously illustrated in the accompanying drawings. The printer 100 is intended for use as a digital photo color printer and is dimensioned to print 100 millimeter by 150 millimeter (4 inch by 6 inch) photos whilst being compact in size and light in weight. As will become apparent from the following detailed description, reconfiguration and dimensioning of the printer could be carried out so as to provide for other printing purposes.

The printer 100 of the illustrated photo printer embodiment has dimensions of 18.6 cm (W); 7.6 cm (H); 16.3 cm (D), and a weight of less than two Kilograms. The compact and lightweight design of the printer provides portability and ease of use.

The printer 100 may be easily connected to a PC via a USB connector 408 (such as a USB 1.1 port for USB 2.0 compatible PCs) and to digital cameras and other digital photo equipment, such as electronic photo albums and cellular telephones, via USB or a PictBridge connector 410. Direct printing is available when using Pictbridge compatible digital photo equipment. This enables quick and convenient printing of digital photo images.

Connection to external power is used, preferably to mains power via a 12 Volt; 2 Amp (or 24 Volt; 1 Amp) DC power converter at power connector 406. However, the printer may be configured to operate from an internal power source, such as batteries. The printer is configured to efficiently use power, operating with a maximum power consumption of 36 Watts.

The printer 100 has three core components: a printhead cartridge 200 housing a printhead and ink supply; a printer or cradle unit 400 for supporting the printhead cartridge and housing a media transport mechanism for transporting print media past the printhead; and a media supply cartridge 600 for supplying the media to the printer.

The following detailed description is direct to the cradle unit 400 and media supply cartridge 600, and therefore detailed description of the printhead cartridge is not provided herein. A full description of a suitable printhead cartridge for use with the cradle unit 400 is described in the Applicant's simultaneously co-filed US Patent Applications (currently identified by their Docket Numbers, which will be substituted once US Serial Numbers are known) Ser. Nos.11/293,804, 11/293,840, 11/293,803, 11/293,833, 11/293,834, 11/293, 835, 11/293,836, 11/293,837, 11/293,792, the entire contents of which are hereby incorporated by reference. For ease of understanding, a brief excerpt of the description provided in these co-pending Applications is provided below under the heading Printhead Cartridge.

Printhead Cartridge

The printhead cartridge 200 is an assembly having the necessary components for operation as a printer when mounted to the printer or cradle unit having a media supply.

Figure 6:
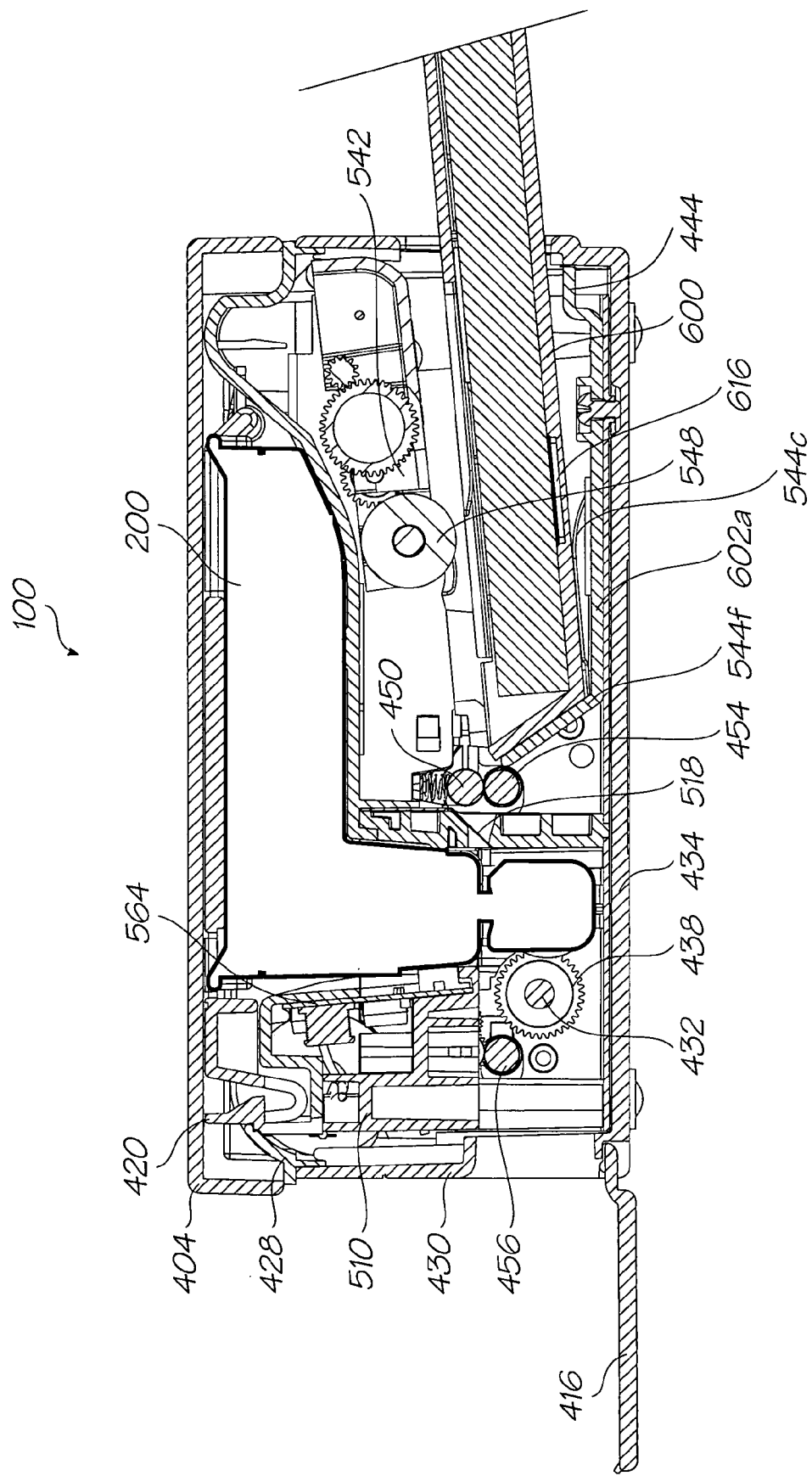
FIG. 6 shows a cross-sectional view of the printer taken along the line I-I of FIG. 2.

The printhead cartridge has a body which is shaped to fit securely in a complementarily shaped printhead cartridge support bay of the cradle unit (see FIG. 6). The body of printhead cartridge houses a printhead and an ink supply for supplying ink to the printhead and has a capper for capping the printhead when the printhead is not in use mounted thereto. A media path is formed between the printhead and the capper for the transport of print media past the printhead by the media transport mechanism of the cradle unit when the capper is not capping the printhead.

The printhead is a pagewidth inkjet printhead. By using a pagewidth printhead it is unnecessary to scan the printhead across print media, rather the printhead remains stationary with the print media being transported therepast for printing. By operating the printhead to continuously print as the print media is continuously fed past the printhead, so called 'printing-on-the-fly', the need to stall the media feed for each print line is obviated, therefore speeding up the printing performed.

The printer incorporating the printhead of the printhead cartridge is configured to print a full colour page, e.g., one 4 inch by 6 inch photo, in at most two seconds. In other words, the printhead is capable of printing at a minimum of 30 pages per minute up to 60 pages per minute. This high speed printing is performed at high quality as well, with a resolution of at least 1600 dots per inch being provided by the printhead. Such a high resolution provides true photographic quality above the limit of the human visual system.

This is achieved by forming the printhead from thousands of ink ejection nozzles across the pagewidth, e.g., about 100 millimeters for 4 inch by 6 inch photo paper. In the illustrated embodiment, the printhead incorporates 32,000 nozzles. The nozzles are preferably formed as Memjet™ or microelectomechanical inkjet nozzles developed by the Applicant. Suitable versions of the Memjet™ nozzles are the subject of a number of the applicant's patent and pending patent applications, the contents of which is incorporated herein by cross reference and the details of which are provided in the cross reference table above.

Brief detail of a printhead suitable for use in the printhead cartridge is now provided. The printhead is formed as a 'linking printhead' which comprises a series of individual printhead integrated circuits (ICs). A full description of the linking printhead, its control and the distribution of ink thereto is provided in the Applicant's co-pending U.S. application Ser. Nos. 11/014,769, 11/014,729, 11/014,743, 11/014,733, 11/014,754, 11/014,755, 11/014,765, 11/014,766, 11/014, 740, 11/014,720, 11/014,753, 11/014,752, 11/014,744, 11/014,741, 11/014,768, 11/014,767, 11/014,718, 11/014,717, 11/014,716, 11/014,732 and 11/014,742, all filed Dec. 20, 2004 and U.S. application Ser. Nos. 11/097,268, 11/097,185, 11/097,184, all filed Apr. 4, 2005 and the entire contents of which are incorporated herein by reference. In the illustrated embodiment, the linking printhead has five printhead ICs arranged in series to create a printing zone of a 100.9 millimeter pagewidth (which is approximately four inches).

Figure 7:
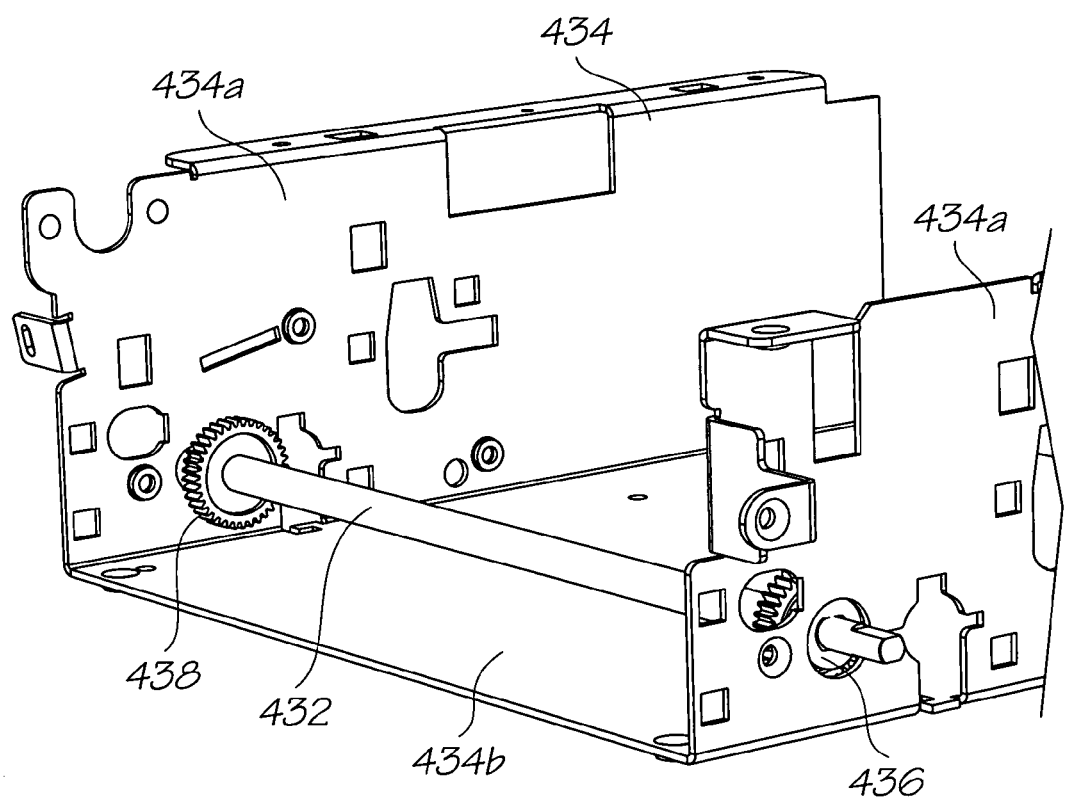
FIG. 7 shows a partial view illustrating a capper shaft supported by a support frame.

Each printhead IC incorporates a plurality of nozzles positioned in rows (see FIG. 7). The nozzle rows correspond to associated ink colours to be ejected by the nozzles in that row. The illustrated embodiment has ten such rows arranged in groups of two adjacent rows for five colour channels. However, other arrangements may be used. In this arrangement, each printhead IC has 640 nozzle per row, 1280 nozzles per colour channel, 6400 nozzles per IC and therefore 32000 nozzles for the five ICs of the printhead.

Figure 8:
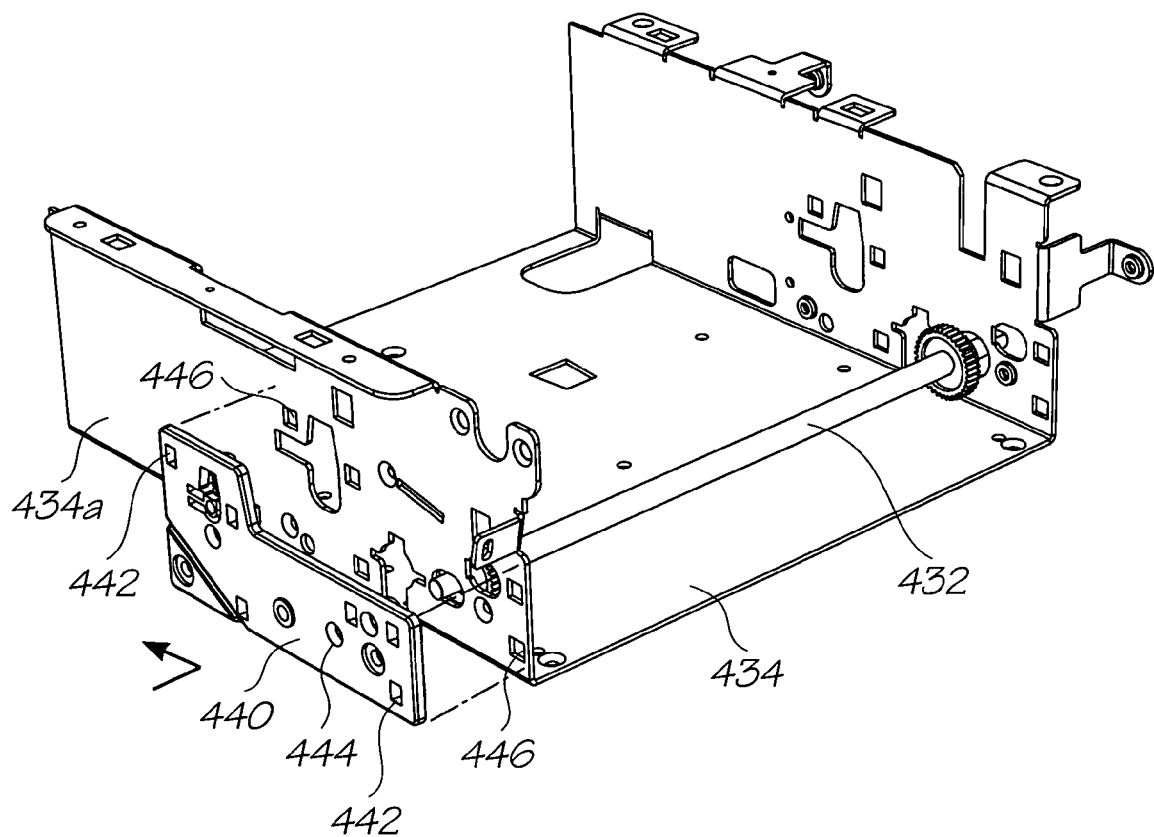
FIG. 8 illustrates assembly of a fixing plate onto the support frame.
Figure 8:
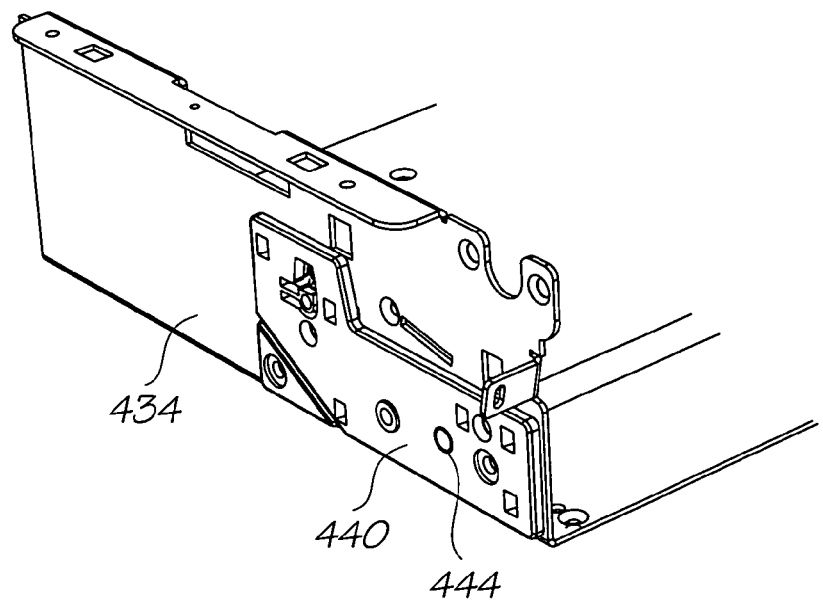

The nozzles are arranged in terms of unit cells containing one nozzle and its associated wafer space. In order to provide the print resolution of 1600 dots per inch, an ink dot pitch (DP) of 15.875 microns is required. By setting each unit cell to have dimensions of twice the dot pitch wide by five times the dot pitch high and arranging the unit cells in a staggered fashion as illustrated in FIG. 8, this print resolution is achieved.

Due to this necessary staggered arrangement of the nozzles discontinuity is created at the interface between the adjacent printhead ICs. Such discontinuity will result in discontinuity in the printed product causing a reduction in print quality. Compensation of this discontinuity is provided by arranging a triangle of nozzle unit cells displaced by 10 dot pitches at the interface of each adjacent pair of printhead ICs, as illustrated in FIG. 9. This nozzle triangle allows the adjoining printhead ICs to be overlapped which allows continuous horizontal spacing between dots across the multiple printhead ICs along the printhead and therefore compensates for any discontinuity. The vertical offset of the nozzle triangle is accounted for by delaying the data for the nozzles in the nozzle triangle by 10 row times. The serially arranged nozzles rows and nozzle triangles of the printhead ICs together make up the printing zone of the printhead.

The printhead cartridge may be operated either in a page-limited mode which sets the number of pages which can be printed using the printhead cartridge (e.g., 200 photo pages) or an ink-limited mode which sets a maximum number of pages that can be printed without depleting the ink of the (non-refillable) ink supply. In this way, the printhead cartridge is caused to be operational within the operational lifetime of the printhead nozzles and within the supply of ink for full colour printing. Other suitable modes for ensuring consistent print quality may also be used.

The arrangement and operation the capper is described in the Applicant's co-pending U.S. patent application Ser. Nos. 11/246,676, 11/246,677, 11/246,678, 11/246,679, 11/246,680, 11/246,681, and 11/246,714, all filed Oct. 11, 2005 and the entire contents of which are hereby incorporated by reference.

Figure 19:
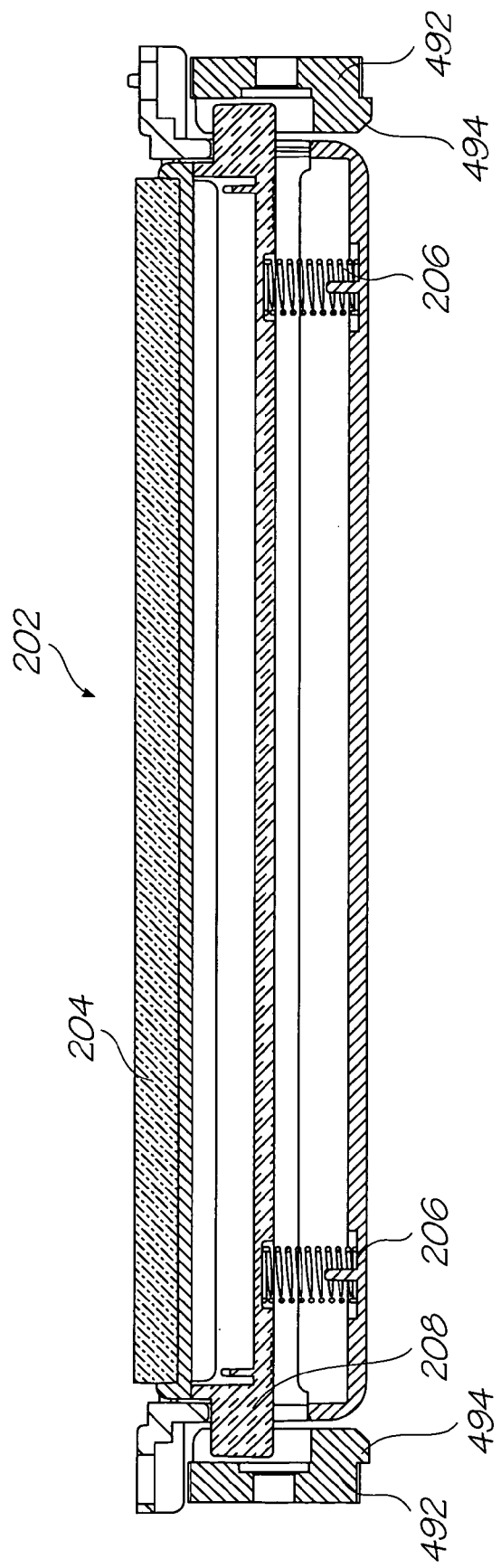
FIG. 19 shows a cross-sectional view of an operational arrangement of capping gears with actuator features of a capper of the printhead cartridge.

For ease of understanding, a brief excerpt of the description provided in these co-pending Applications is now provided. As illustrated in FIG. 19, the capper 202 of the printhead cartridge 200 has an elongate cap 204 which is biased by springs 206 into its capping position on the printhead. The cap 204 has lugs or actuation features 208 protruding from each longitudinal end which are used to move the cap into and out of its capping position.

In the capping position, the contact surface of the pad, which defines the capping zone, sealingly engages with the nozzles of the printhead thereby capping or covering the nozzles. This capping isolates the ink within the nozzles from the exterior, thereby preventing evaporation of water from the primed ink from the nozzles and the exposure of the nozzles to potentially fouling particulate matter during non-operation of the printhead. In the non-capping position, the contact surface is disengaged from the nozzles, allowing printing to be performed.

The manner in which the capper 202 is operated in cooperation with the cradle unit 400 when the printhead cartridge 200 is mounted to the cradle unit 400 is described in detail later.

Cradle Unit

The printer or cradle unit 400 is an assembly having the necessary components for operation as a printer when the printhead and media supply cartridges are mounted.

From the exterior, the cradle unit 400 has a body 402 and a lid 404 hinged to the body 402. The body 402 houses the power connector 406, the data (USB and PictBridge) connectors 408 and 410, a media supply cartridge slot 412, a printed media exit slot 414, which is normally covered with a pivotable flap 416, and a control panel 418.

With the lid 404 hinged in its open position, a levered frame 420 is exposed. The open position of the levered frame 420 allows access to a printhead cartridge support bay 422 for insertion and extraction of the printhead cartridge 200. The closed position of the levered frame 420, via a snap fit of a clip 424 with a release detail 426 of the body 402, secures an inserted printhead cartridge in operational position.

The printhead cartridge support bay 422 and release detail 426 are part of an upper portion 428 of the body 402 which cooperates with a lower portion 430. The cooperation of the upper and lower portion 430s, which are preferably plastic moldings, creates an outer shell of the body 402 used to house the internal components of the cradle unit 400.

Figure 5:
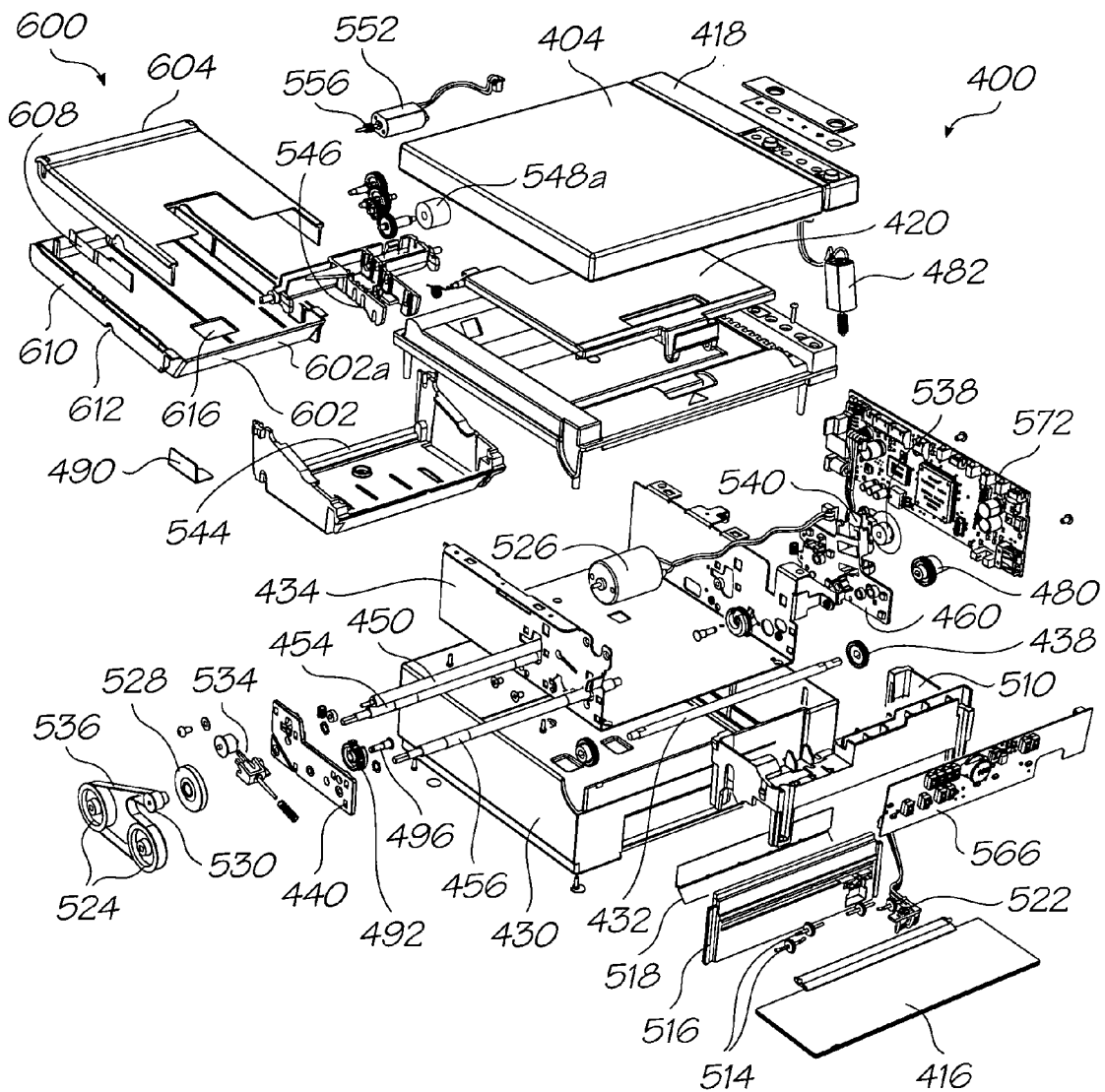
FIG. 5 shows an exploded view of the cradle unit and a media supply cartridge of the printer.

The internal components are shown in exploded and cross-sectional views in FIGS. 5 and 6. For ease of understanding, the following description of the internal components of the cradle unit 400 and their relationship with the body 402 and printhead and media supply cartridges is made in terms of their assembly to form the cradle unit 400.

An elongate capper shaft 432 is inserted at either end into a support frame 434 by feeding the ends through slots or apertures 436 arranged on opposite sidewalls 434a of the support frame 434. The sidewalls 434a of the support frame 434 are joined by a base 434b. The capper shaft 432 has a gear 438 fitted at either end which form part of a gearing assembly for operating the capper of the printhead cartridge.

Figure 9A:
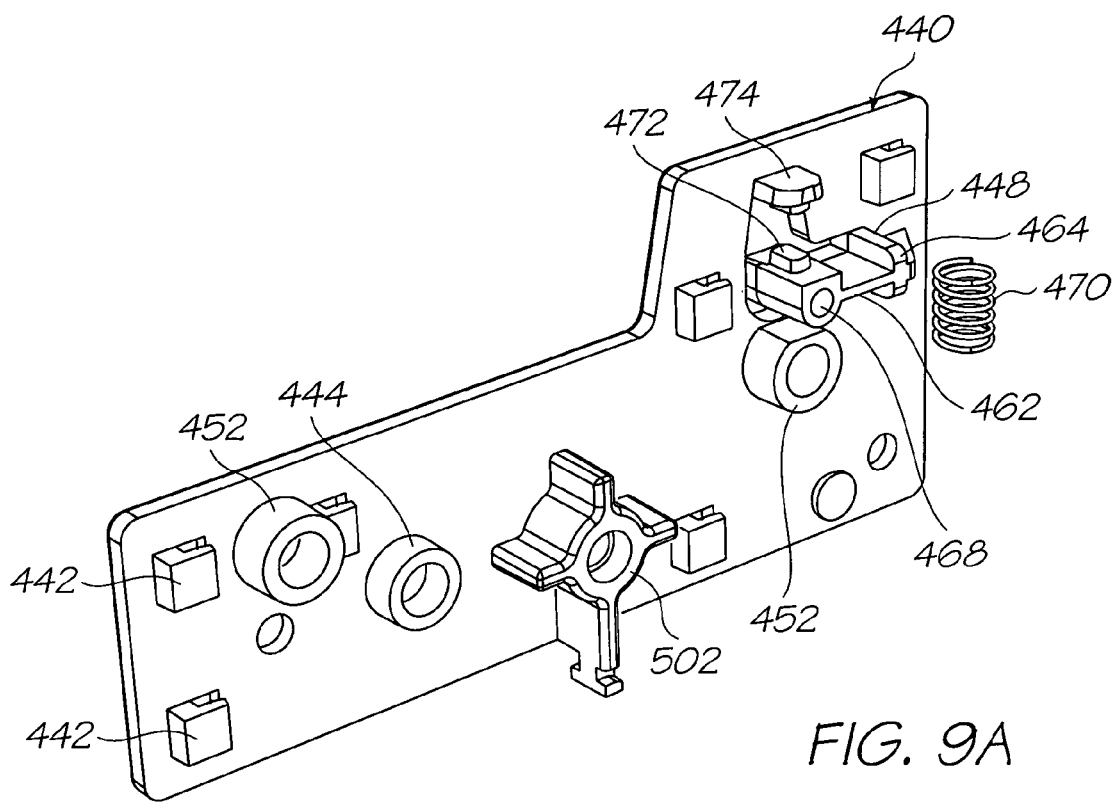
FIGS. 9A and 9B respectively illustrate the fixing plate without and with a spring fitted.
Figure 9B:
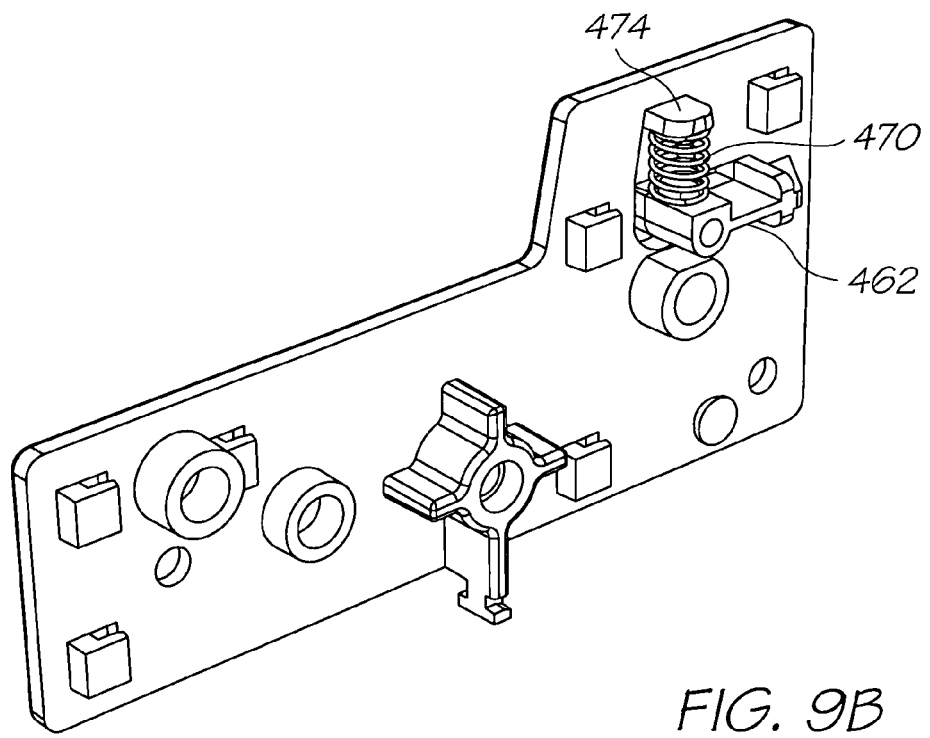

A first end of the capper shaft 432 is fixed in place by a fixing plate 440 which is mounted to the support frame 434 as illustrated in FIG. 8. The fixing plate 440 has a number of tabs or hook features 442 (six are shown in FIGS. 8 and 9A) and a roller or ring bearing 444 for locating the first end of the capper shaft 432. The bearing aperture is arranged to align with the apertures 436 of the support frame 434 through which the capper shaft 432 projects. The bearing 444 is configured to allow the capper shaft 432 to rotate.

To assemble, the hook features 442, which have an "L" shaped profile as can be seen in FIG. 9A, are engaged with slots 446 in the support frame 434 whilst ensuring that the first end of the capper shaft 432 locates in the bearing aperture. The hook features 442 are configured to flex snap within the slots 446 so as to secure the fixing plate 440 to the support frame 434 by sliding of the hook features 442 within the slots 446. In this way, first end of the capper shaft 432 is fixed to the support frame 434. In the present embodiment, the hook features 442 are configured so that the fixing plate 440 is slid two millimeters before being secured, as shown by the arrow in FIG. 8. Additional securement of the fixing plate 440 may be provided by suitable means, such as screws.

Figure 10A:
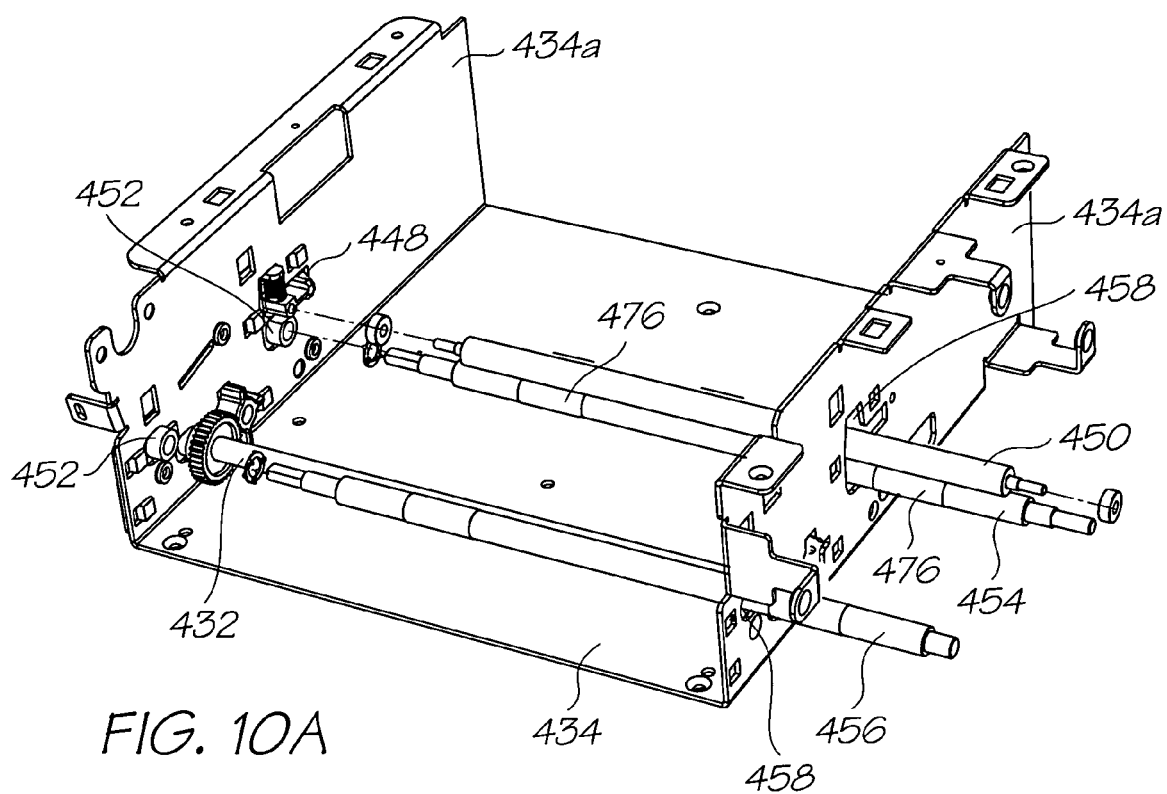
FIGS. 10A and 10B illustrate assembly of media transport rollers into the support frame.
Figure 10B:
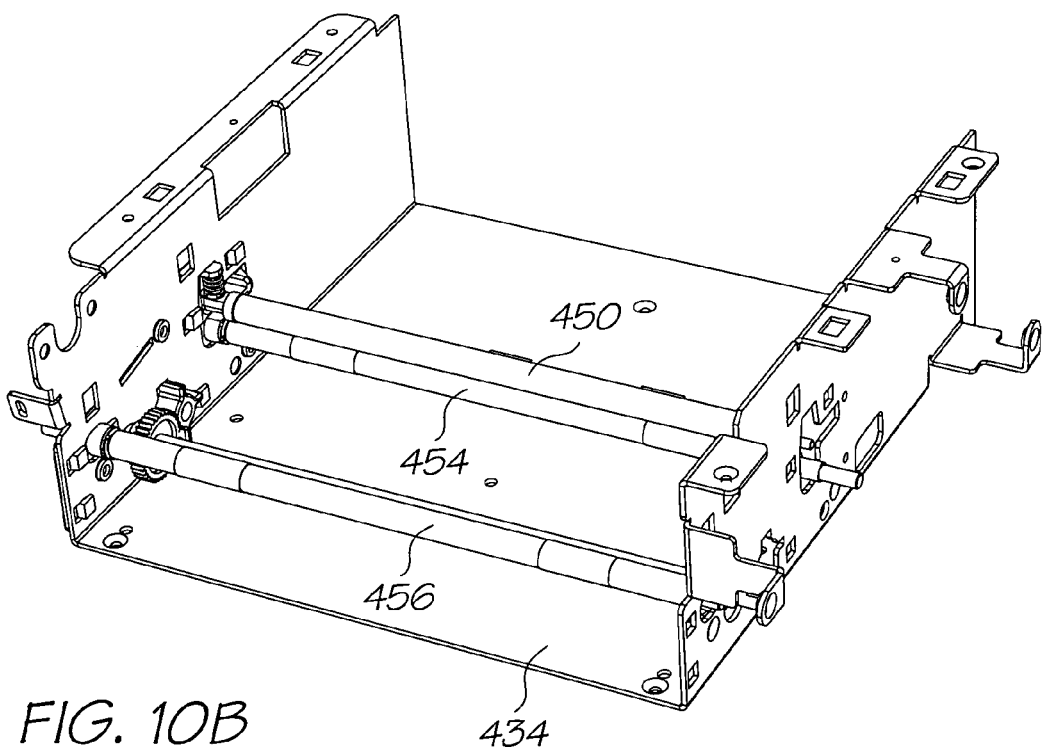

The fixing plate 440 has a locator 448 for an elongate idler roller 450 and further roller or ring bearings 452 for locating an elongate entry or drive roller 454 and an elongate exit roller 456. The drive, idler and exit rollers are part of a media transport mechanism of the cradle unit 400. The rollers are assembled into the support frame 434 by passing them through associated apertures 458 in the sidewalls 434a of the support frame 434 and then into the locator 448 and bearings 452, which are aligned with the support frame apertures 458, as illustrated in FIG. 10A. The rollers are thereby fixed at their first ends to the support frame 434 by the fixing plate 440, as illustrated in FIG. 10B.

The idler roller 450 has its own bearings on the roller shaft at either end, which locate within the locator 448 so that the idler roller 450 can rotate. The bearings 452 of the fixing plate 440 are also configured so that the drive and exit roller 454, 456 can rotate. Suitable thrust washers and the like may also be used on the rollers to facilitate location and rotation.

The second ends of each of the capper shaft 432 and drive, idler and exit rollers 454,450,456 are fixed to the opposite sidewall 434a of the support frame 434 by a second fixing plate 460. As with the first fixing plate 440, the second fixing plate 460 has a number of "L" shaped hook features 442 (six are shown in FIGS. 11 and 12A) which are engaged with slots 446 in the support frame 434 to flex snap therein by sliding of the hook features 442 within the slots 446, as shown by the arrow in FIG. 11.

Figure 11:
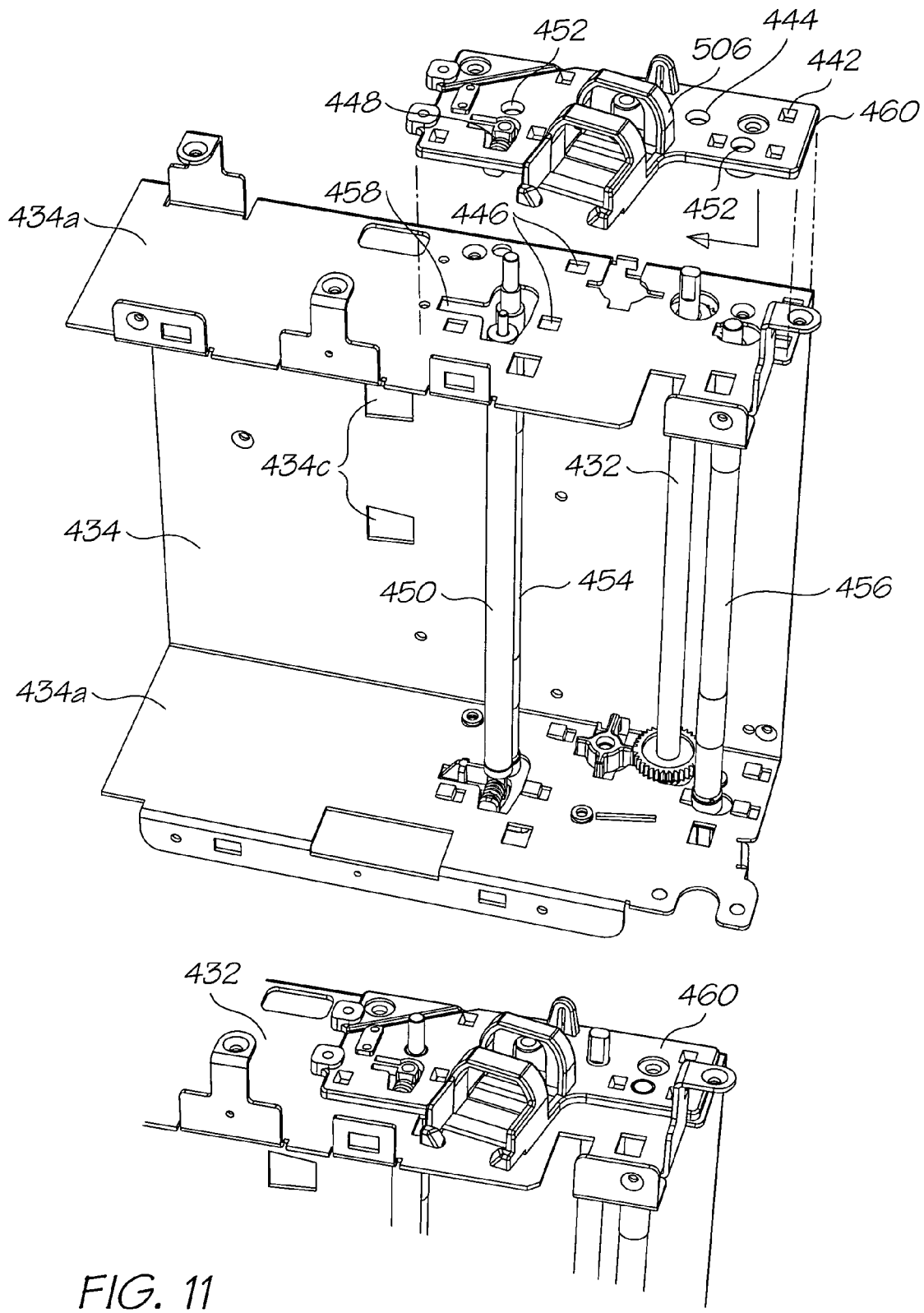
FIG. 11 illustrates assembly of a second fixing plate onto the support frame.
Figure 12A:
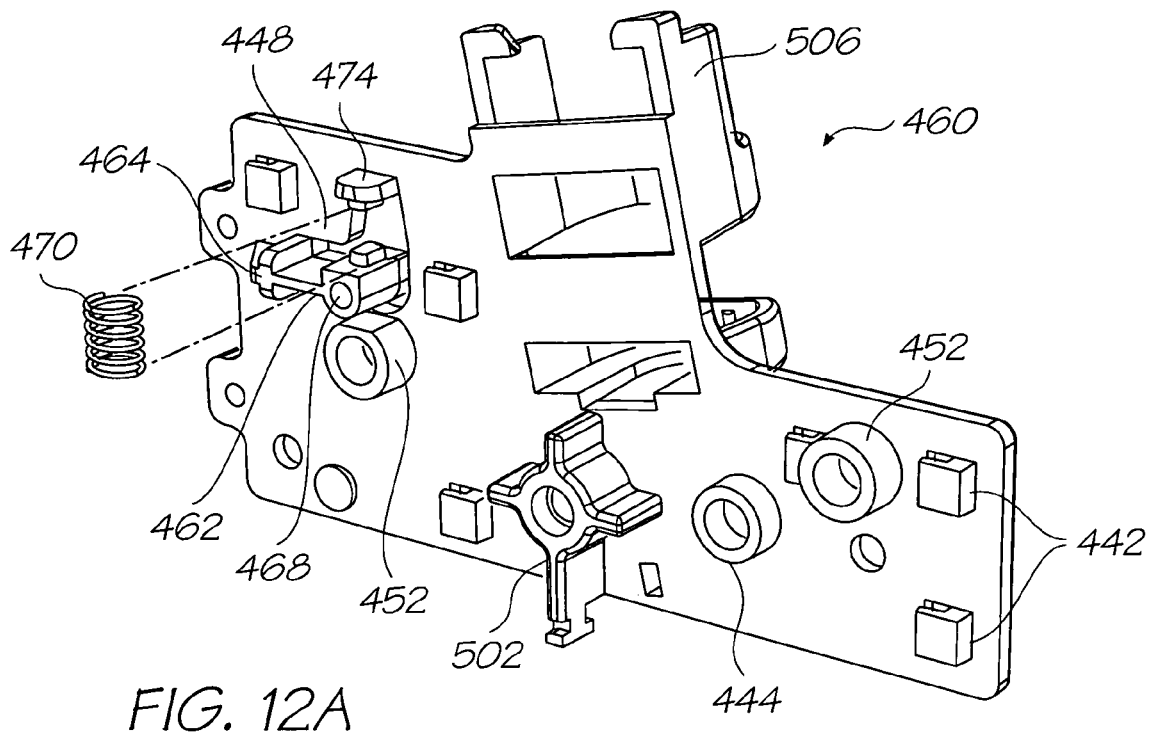
FIGS. 12A and 12B respectively illustrate the second fixing plate without and with a spring fitted.
Figure 12B:
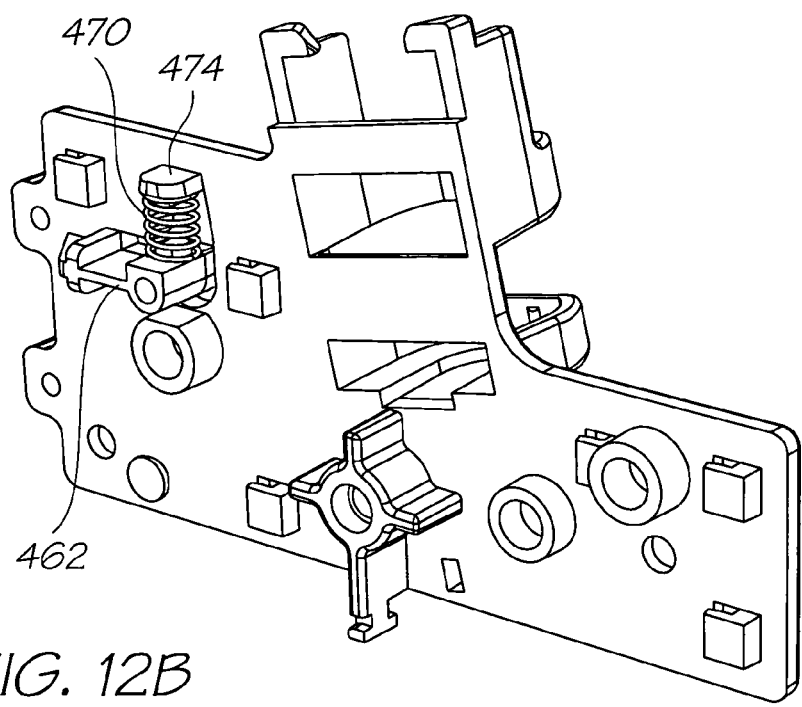

Further, as with the first fixing plate 440, the second fixing plate 460 has roller bearings 444 and 452 for locating the second ends of the respective capper shaft 432, drive roller 454 and exit roller 456 and a locator 448 for locating the bearing on the second end of the idler roller 450 (as illustrated in FIG. 11). Again, the bearing apertures are arranged to align with the apertures of the support frame 434 through which the capper shaft 432 and rollers 454,456 project and the bearings 444,452 are configured to allow the capper shaft and rollers to rotate.

The locators 448 of the fixing plates 440,460 for supporting the idler roller 450 shaft are illustrated in FIGS. 9A, 9B, 12A and 12C. As can be seen from these drawings, the locators 448 are each formed as an arm 462 which projects from a flexible pivot point 464 into a slot 466 formed in the fixing plates 440,460. The idler roller 450 shaft locates in a hole 468 in the arms 462. Springs 470 locate on protrusions 472 on the arms 462 so as to be compressed and held between the arms 462 and protrusions 474 on the fixing plates 440,460. The springs 470 allow the idler roller 450 to move relative to the drive roller 454, which is located beneath the idler roller 450 as seen in the drawings. The range of movement is controlled by the springs 470 which ensures that the idler roller 450 returns to its stationary position. This stationary position sets a minimum gap between the drive and idler rollers and the movement facilitates the transport of media between the drive and idler rollers.

In particular, the minimum gap is set to be less than the thickness of the print media which is to be transported by the drive and idler rollers. In the present embodiment, the minimum gap is set to be about 200 microns when photo paper having a thickness of at least 250 microns is used. Media of other thicknesses could be used, and therefore other suitable minimum gaps set.

The sprung movement of the idler roller 450 away from the drive roller 454 allows the media to pass therebetween whilst being contacted by both the drive and idler rollers as the drive roller is rotationally driven (described in detail later). This 'pinch' of the rollers 450 and 454 on the media ensures that appropriate friction is imparted on the media for trouble-free and effective transport.

In the present embodiment, the drive roller 454 is provided as a plain shaft roller having a substantially gripless surface. That is, the plain shaft is not provided with a grip or grit surface or other friction providing surface. The Applicant has found that, surprisingly, the effective pinch of the rollers is retained in the printer 100 when such a gripless drive roller 454 is used. A gripless idler roller may also be used. In the illustrated embodiment, the drive roller 454 has a smooth surfaced tubular sleeve 476 (two are illustrated in the drawings) arranged on a shaft. The tubular sleeve may be, for example, formed from smooth plastic or rubber.

As can be seen from FIG. 6, the path of the media from the pinch of the drive and idler rollers 450,454 to the exit roller 456 past the inserted printhead is a substantially straight path. By configuring the printing path in this way, high printing speeds and quality are supported.

The fixing plates 440,460 are preferably plastic moldings with each of the hook features 442, locators 448, arms 462, protrusions 474 and bearing apertures formed as part of the molding. The support frame 434 is preferably press formed from metal to form the illustrated chassis.

The bearings 444,452 of the fixing plates 440,460 are configured to allow pivotal movement of the capper shaft 432 and rollers 450,454,456 during assembly. This pivotal movement is needed due to the angular mismatch between the first and second ends of the capper shaft 432 and rollers 454,456 when they are positioned in the mounted first fixing plate 440 and yet to be mounted second fixing plate 460. This angular movement of the rigid shaft and rollers is required so that potentially damaging stresses are not placed on the shafts, rollers, bearings and/or support frame. In the final mounted position, the configuration of the bearings 444,452 align the capper shaft 432 parallel to the capper and align the rollers 454,456 perpendicular to the transport direction of print media.

Figure 13A:
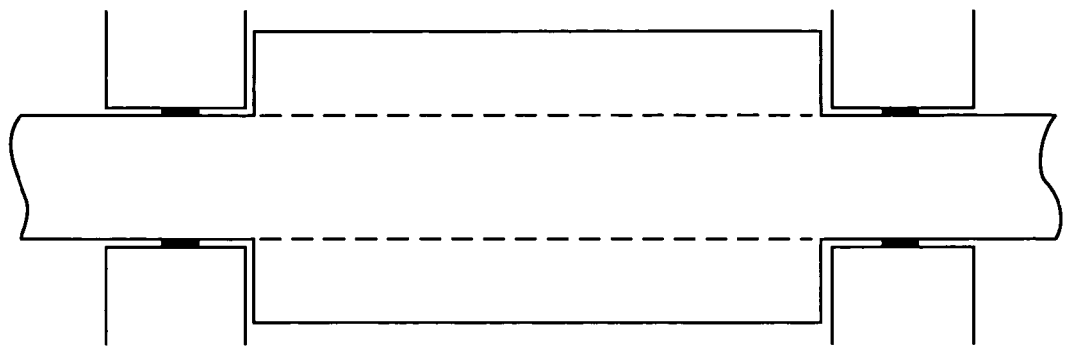
FIG. 13A illustrates a conventional bearing arrangement for a roller shaft.

Conventional roller or ring bearings for a shaft/roller are illustrated in FIG. 13A. As can be seen, due to the flat face of the bearing mount the range of angular movement of a shaft/roller held by the bearings is very limited.

Figure 13B:
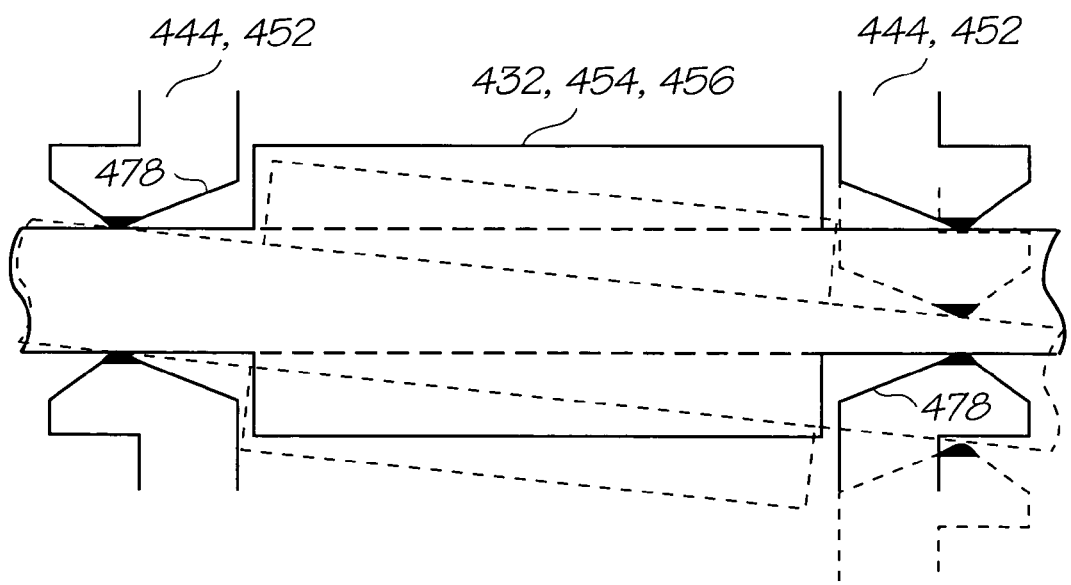
FIG. 13B illustrates a bearing arrangement of the fixing plates.

The bearing mount or contact face 478 of the roller bearings 444,452 of the present invention has an angular or triangular face with respect to the capper shaft 432 and rollers 454,456. As such, a relatively wide range of angular movement of the capper shaft and rollers, characterised by pivotal movement about the first end of the capper shaft and rollers as illustrated by the solid and dashed depictions in FIG. 13B, is made possible.

Other suitably configured bearing mounts or contact faces may also be used, so long as the required range of angular displacement of the capper shaft 432 and rollers 454,456 is accommodated. The range of angular displacement to be accommodated may be of the order of about one or two degrees. The sprung locators 448 of the fixing plates 440,460 similarly provide for the angular movement of the idler roller 450 during assembly.

Further, the slots/apertures 436,458 of the support frame 434 are configured so as to accommodate the linear movement of the capper shaft and roller ends during assembly. The additional space provided within the slots/apertures does not cause any unwanted movement of the capper shaft and rollers once assembled due to the rigid capture of the capper shaft and rollers by the fixing plates 440,460.

Figure 14A:
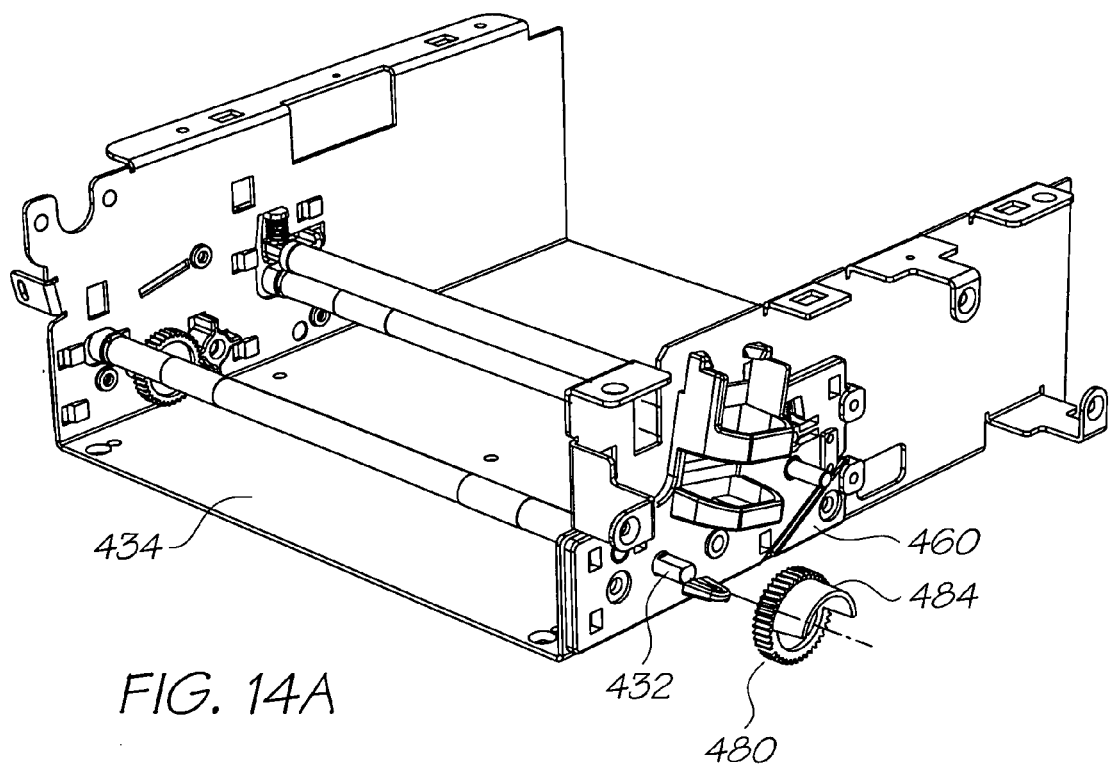
FIGS. 14A and 14B illustrate assembly of a coded gear on the capper shaft.
Figure 14B:
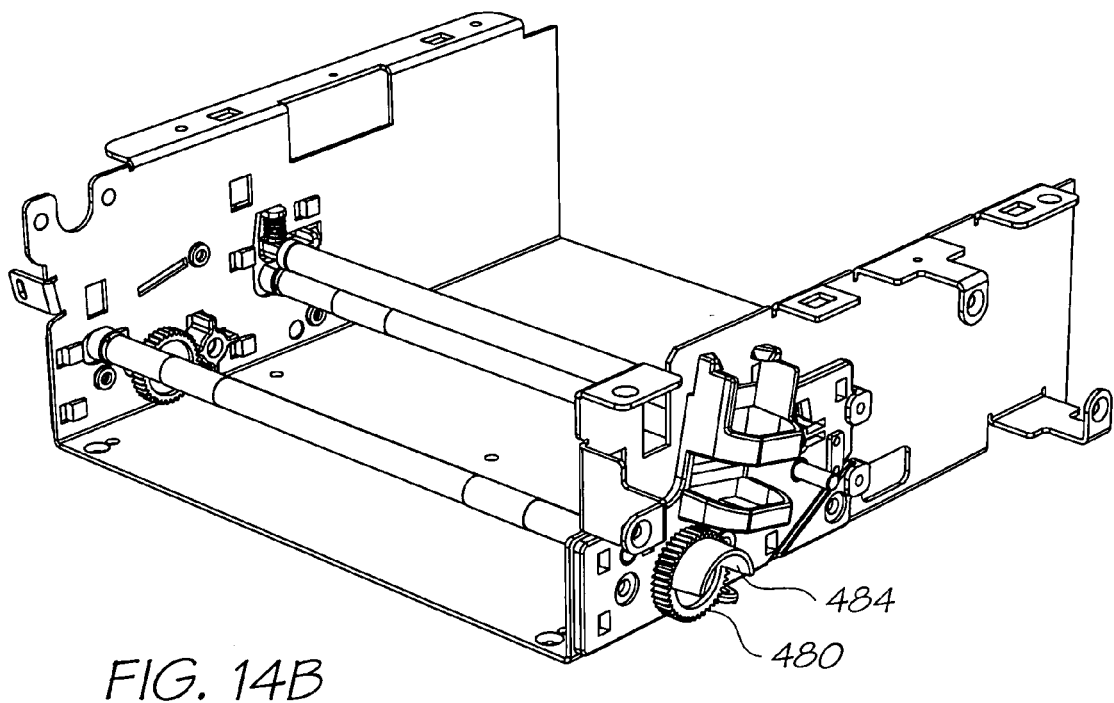

With the capper shaft 432 held in position to the support frame 434 by the fixing plates 440,460, a third gear 480 of the gearing assembly is fitted to the second end of the capper shaft 432 at the exterior of the fixing plate sidewall, as illustrated in FIGS. 14A and 14B. The gear 480 is arranged to communicate with a motor 482 for driving rotation of the capper shaft 432 (discussed later).

The gear 480 is provided with a code feature 484 formed as a protrusion from the outer surface of the gear with respect to the gear's teeth. In the illustrated embodiment, the code feature protrusion has as a half-cylindrical shape, however, other types of protrusions may be used. Preferably, the gear and protrusion are formed as a molding.

Figure 15:
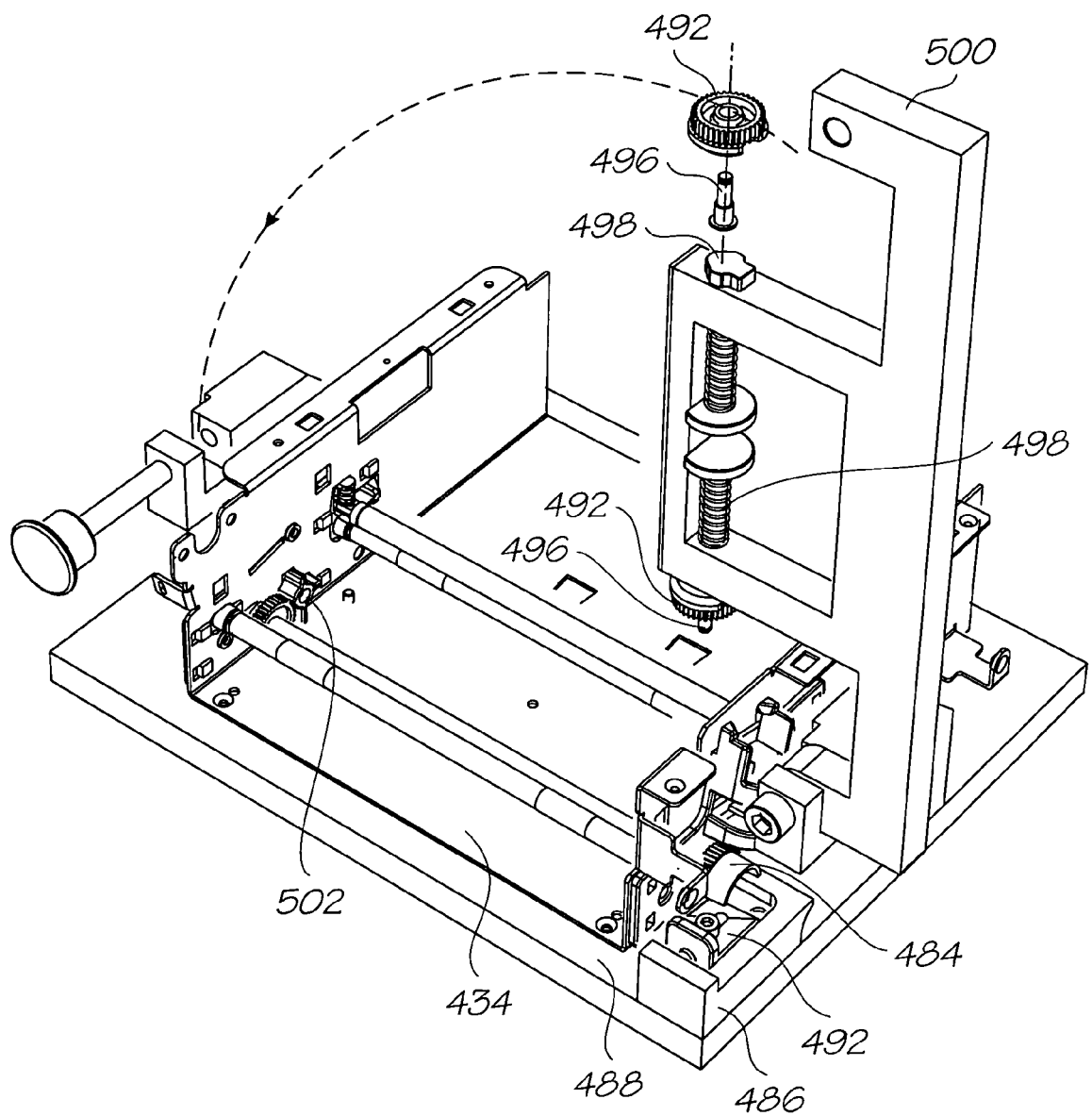
FIG. 15 shows a perspective view of the support frame within a jig and illustrates a holding arrangement for the coded gear.

The code feature 484 is arranged to cooperate with a holding feature 486 of a jig or mounting arrangement 488 used in the next stage of assembly. As illustrated in the magnified portion of FIG. 15, the holding feature 486 comprises a slider block 490 which is slid into position about the code feature 484. In this way, uncontrolled rotation of the capper shaft 432 is eliminated during this assembly stage. Such rotation is unwanted due to the need to maintain correct capping timing in order to ensure correct and efficient operation of the capper.

Figure 16:
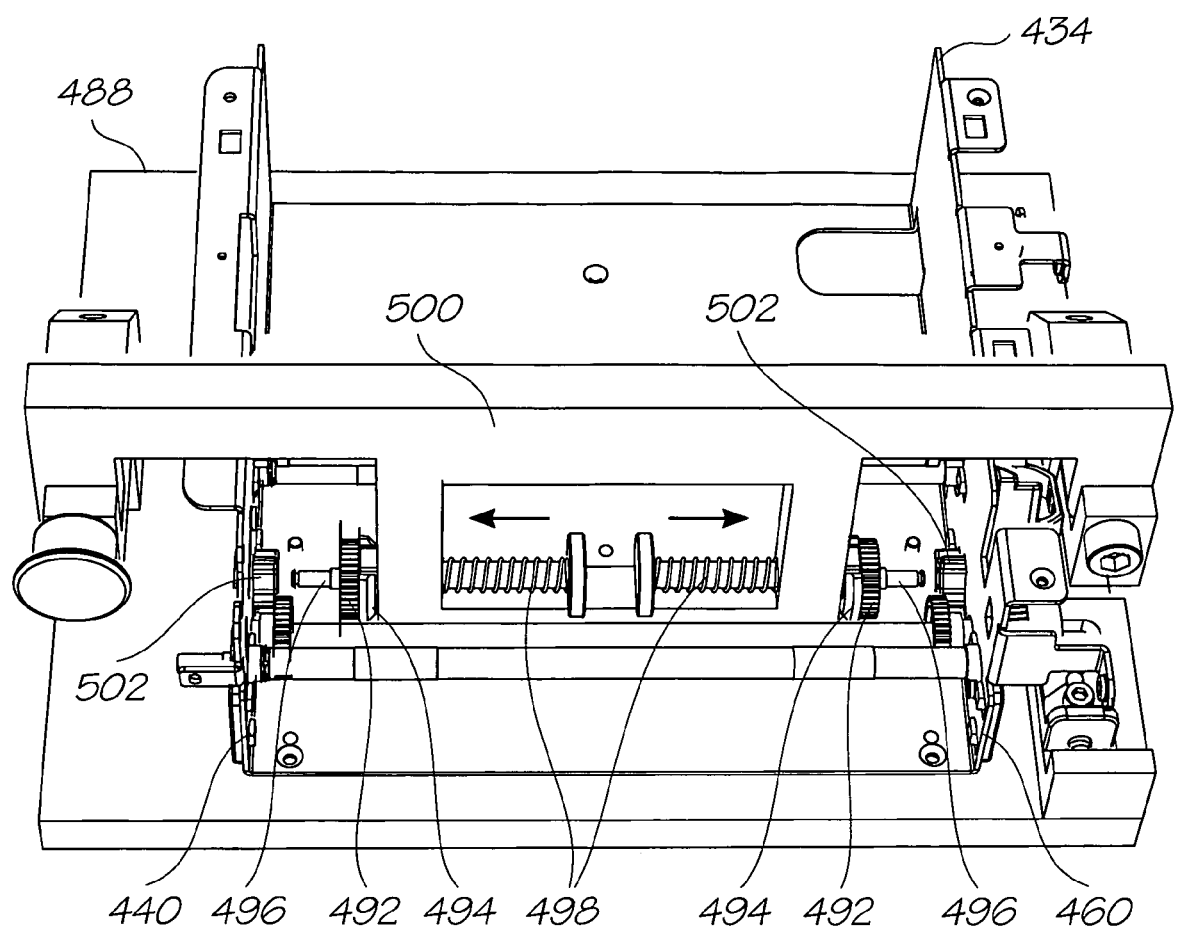
FIGS. 16 and 17 illustrate respective operational positions of the jig.
Figure 17:
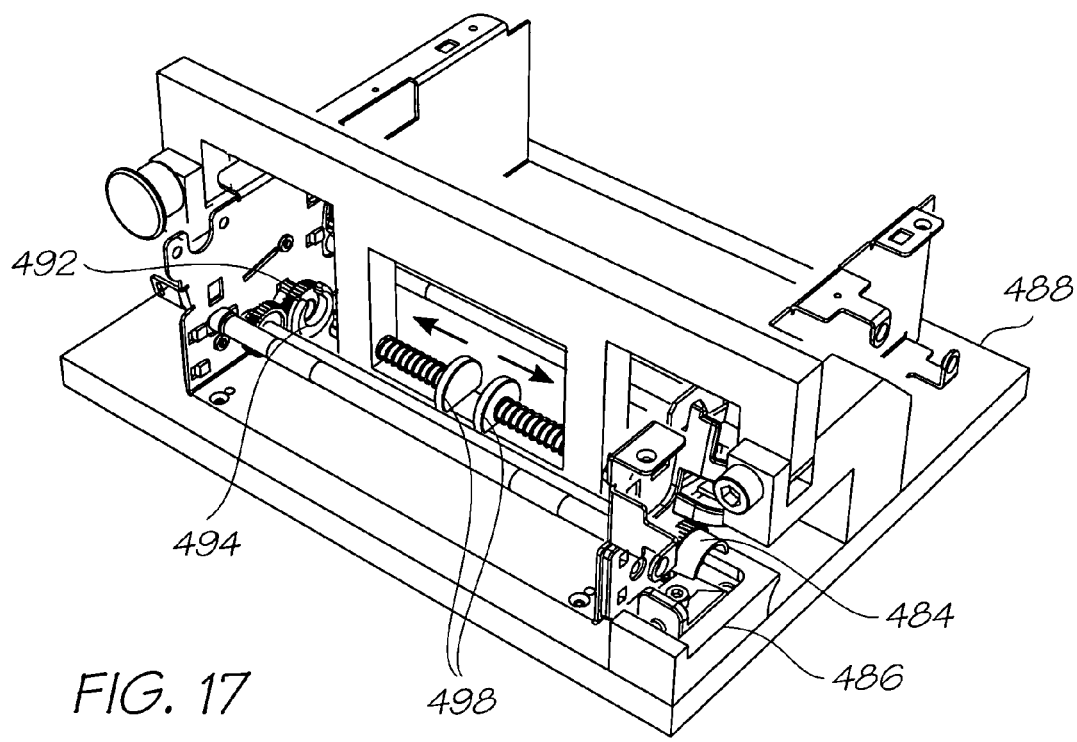
Figure 18:
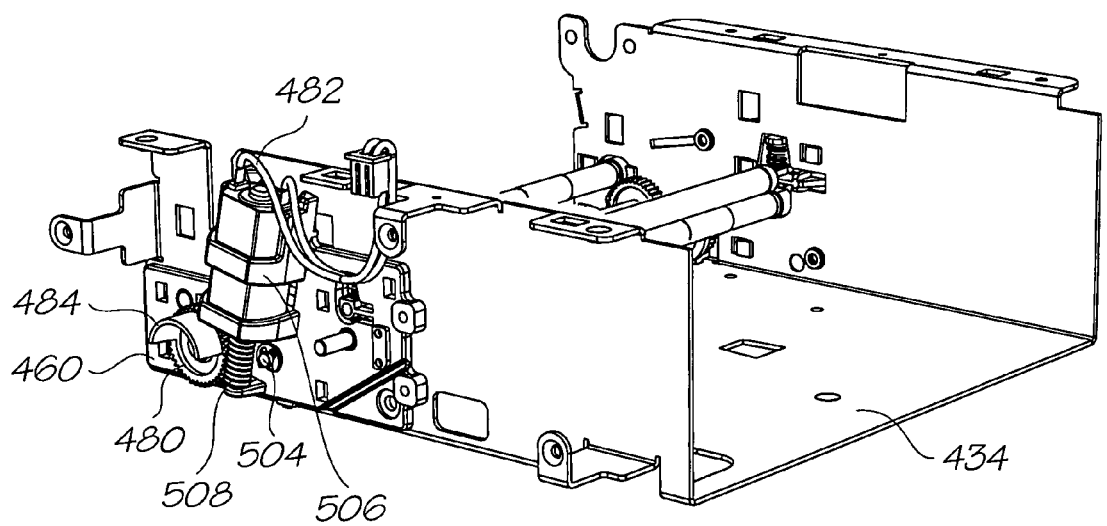
FIG. 18 shows a perspective view of a motor for driving rotation of the capper shaft.

The jig 488 is used to mount further gears of the gearing assembly of the capping mechanism to the support frame 434. The further gears are eccentric gears 492 having an eccentricity or cam feature 494, as illustrated in FIGS. 17 and 19. The eccentric gears 492 are positioned on associated retaining pins 496 on plungers 498 arranged on an arm 500 of the jig 488. The jig arm 500 is pivoted down to and locked at a mounting position for the eccentric gears 492 (see FIG. 16). The plungers 498 are then used to locate the eccentric gears 492 via the retaining pins 496 in apertured features 502 of the fixing plates 440,460 adjacent the bearing apertures for the capper shaft 432 (see FIG. 17). The retaining pins 496 are then held in place by suitable clips 504, such as "E" clips, which are positioned on the pins at the exterior of the support frame sidewalls 434a,434b whilst the jig 488 is in place (FIG. 18 illustrates one of the clips in place). The eccentric gears 492 are provided with bearings to freely rotate about the retaining pins.

During the location of the eccentric gears 492, the teeth thereof mesh with the teeth of the gears 438 positioned on the capper shaft 432, where this meshing is used to transfer rotation of the shaft gears 438 to the eccentric gears 492. Without the engagement of the code and holding features, this meshing may cause the aforementioned uncontrolled rotation of the capper shaft 432, placing the eccentric gears 492 in an unknown position.

Once the eccentric gears are clipped in place, the assembly is removed from the jig. Whilst the illustrated embodiment uses the jig to mount the eccentric gears to the support frame, some other means of mounting the eccentric gears, including by picker robot or hand, is possible, so long as a holding feature is provided to engage and hold the code feature of the coded gear during mounting.

The motor 482 for driving the capping shaft 432, and in turn the eccentric gears 492, is fitted into a seat 506 formed in the second fixing plate 460, as illustrated in FIG. 18. A worm gear 508 located on a shaft of the motor 482 is meshed with the coded gear 480 of the capper shaft 432, in order to transfer motor force to the capper shaft.

Some rotation of the coded gear occurs during the meshing of the coded and motor gears. However, as the position of the eccentric gears is known this rotation can be corrected at power up of the printer to correctly position the eccentricity features of the eccentric gears (discussed later).

The eccentricity feature 494 of each eccentric gear 492 is formed as a protrusion from the outer surface of the eccentric gear with respect to the eccentric gear's teeth. In the illustrated embodiment, the eccentricity feature protrusion has as a semi-cylindrical shape, however, other types of protrusions may be used. Preferably, the eccentric gears and protrusions are formed as a molding.

Figure 20A:
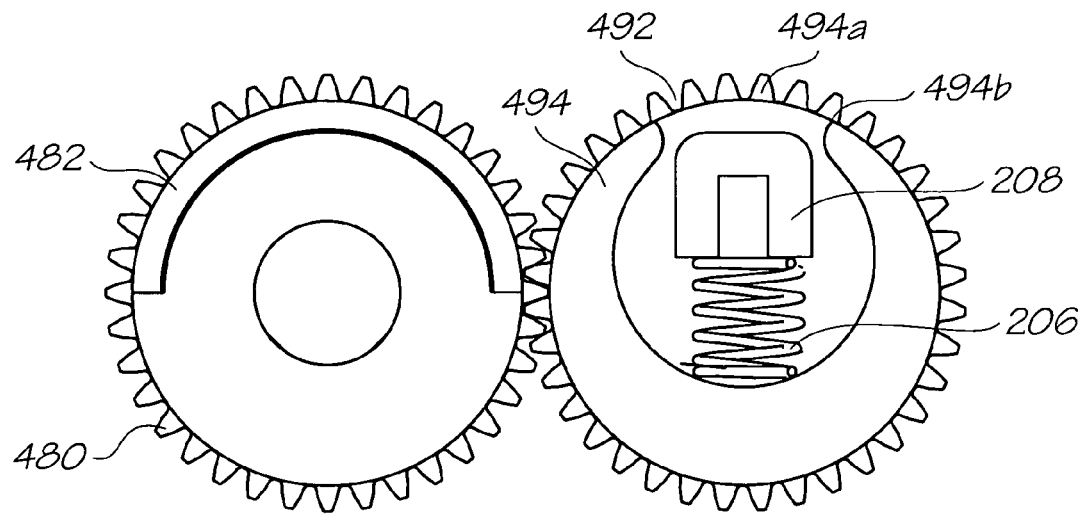
FIGS. 20A and 20B respectively illustrate the positions of the coded gear, one of the capping gears and associated actuator feature during operation of the capper.

The eccentricity features 494 are used to operate the capper of the printhead cartridge 200. In the normal position of the eccentric gears 492, the eccentricity features 494 are positioned so that an open part 494a of the eccentricity features 494 faces towards the position of the capper when the printhead cartridge 200 is inserted into the cradle unit 400 (see FIG. 6). In this way, the lugs 208 on the capper 202 locate within the eccentricity features 494, as illustrated in FIGS. 19 and 20A. In this arrangement, the cap 204 of the capper 202 is positioned against the printhead.

Figure 20B:
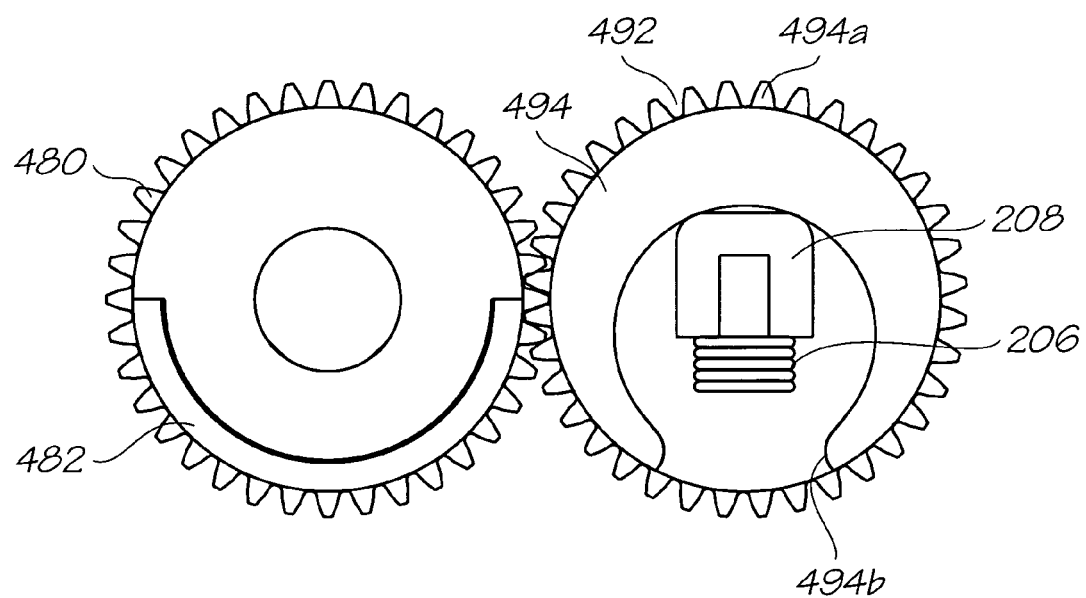

When it is desired to print, the motor 482 is operated to rotate the capper shaft 432 via the coded gear 480. This causes rotation of the eccentric gears 492 via the shaft gears 438. The gear train of the capping mechanism provides a gearing ratio of 40:1 at the capper. The eccentricity features 494 have cam contact faces 494b which contact the lugs 208 of capper 202 during this rotation. This contact causes a lowering force on the lugs 208 which is transferred to the sprung cap 204,206 of the capper 202, thereby lowering the cap 204 and exposing the printhead for printing. The rotation is ceased once the open part 494a of the eccentricity features 494 faces away from the position of the capper 202, as illustrated in FIG. 20B.

When printing is complete or capping is otherwise desired, the motor 482 is again operated to rotate the eccentric gears 492 until the open part 494a of the eccentricity features 494 again faces toward the capper 202. In this position, the lugs 208, and therefore the sprung cap 204, return to the capped position.

Figure 21:
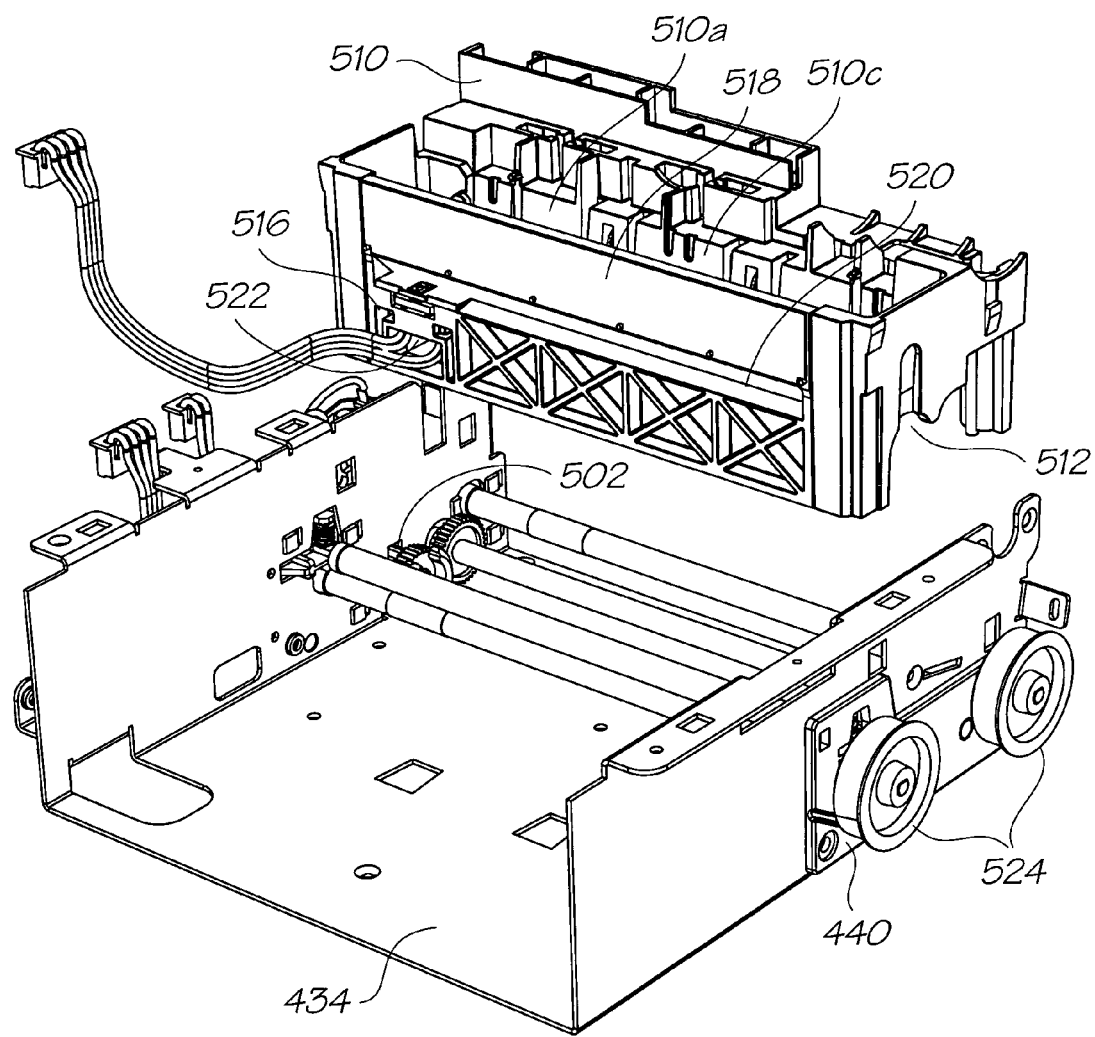
FIG. 21 illustrates insertion of a printhead cartridge support in the support frame.

Returning to the assembly, a printhead cartridge support 510 is positioned in the support frame 434, as illustrated in FIG. 21. The sidewalls 434a of the support frame 434 are designed to flex to allow insertion of the printhead cartridge support 510. Once inserted, the printhead cartridge support 510 is held in the support frame 434 by the engagement of the apertured features 502 for holding the eccentric gears 492 and slotted features 512 in the printhead cartridge support 510. The printhead cartridge support 510 supports, in cooperation with the upper portion 428 of the body 402, the printhead cartridge and provides reference alignment of the printhead with respect to the cradle unit when the printhead cartridge is inserted into the cradle unit.

The printhead cartridge support 510 has spike wheels 514 (see FIG. 5) which cooperate with the exit roller 456 to assist the ejection of print media from the printhead. A print media guide 516 for guiding the print media past the printhead is also provided in the printhead cartridge support 510. The print media guide 516 includes a flexibly mounted foil 518 for providing a resilient guiding force on the leading edge of the print media transported from the media supply cartridge 600 by the drive and idler rollers 450,454 as the media enters a media slot 520 of the media guide 516 (see FIGS. 5, 6 and 21). The foil is preferably made of Mylar.

Figure 22:
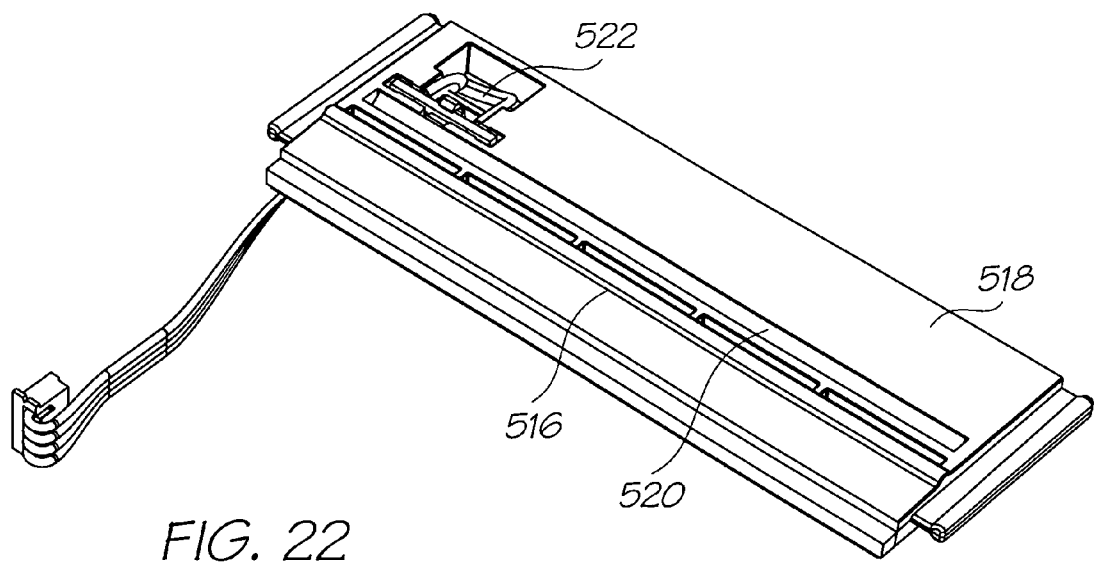
FIG. 22 illustrates a media sensor of a print media guide.

A media sensor 522 is provided in the media guide 516 (see FIG. 22) for sensing the leading and trailing edges of the print media so that printing may be accurately controlled based on the position of the print media relative to the printhead. This is achieved by the accurate positioning of the media sensor 522 in the mounted printhead cartridge support 510 which provides a fixed offset between the media sensor 522 and the first row of printhead nozzles. An offset of the order of 33 millimeters provides a sufficient delay between a sensed leading edge and start of printing. The illustrated media sensor 522 is an opto-electric transceiving sensor which emits light into the media slot 520 and senses the amount of light return. When media is in the light path, a change in the amount of light is detected.

Figure 23:
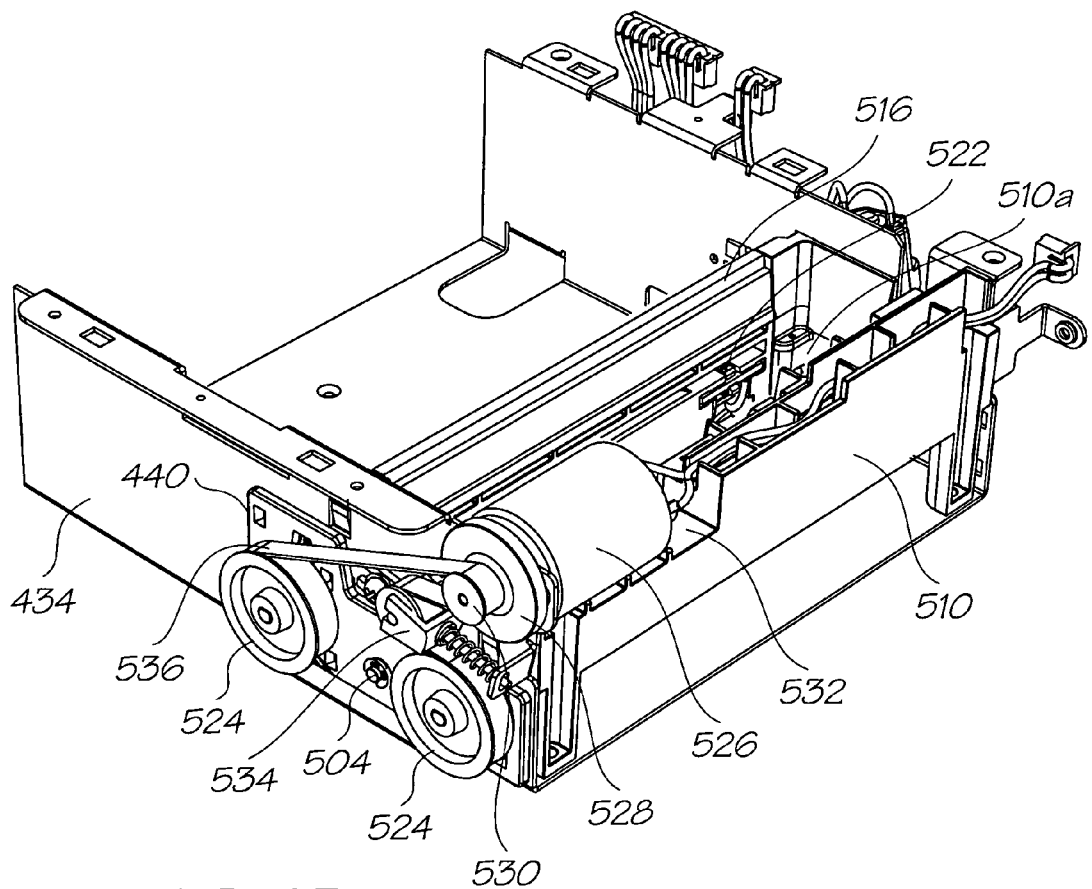
FIG. 23 shows a perspective view of a media transport drive arrangement mounted on the support frame.

With the printhead cartridge support 510 in place, a media transport drive arrangement is assembled on the support frame 434. This is done by fitting pulley wheels 524 onto the first ends of the drive and exit rollers 454,456, mounting a drive motor 526 with associated inertia flywheel 528 and pulley wheel 530 in a motor bay 532 of the printhead cartridge support 510, mounting a tensioner 534 to the sidewall 434a of the support frame 434 and feeding a drive belt 536 over the pulley wheels 524,530 and tensioning it with the tensioner 534 (see FIG. 23).

The tensioned drive belt 536 transfers the driving force of the drive motor 526 to the pulley wheels 524 and therefore the drive and exit rollers 454,456. The resultant rotation of the drive and exit rollers is used and controlled to transport the print media from the media supply cartridge past the printhead of the inserted printhead cartridge and out through the printed media exit slot 414 in the body 402.

In the illustrated embodiment, the drive belt is a smooth endless belt, and the tensioner is used to provide proper operational tensioning of the smooth belt about the smooth pulley wheels. However, a corrugated or like drive belt may be used in conjunction with toothed pulley wheels.

Figure 24:
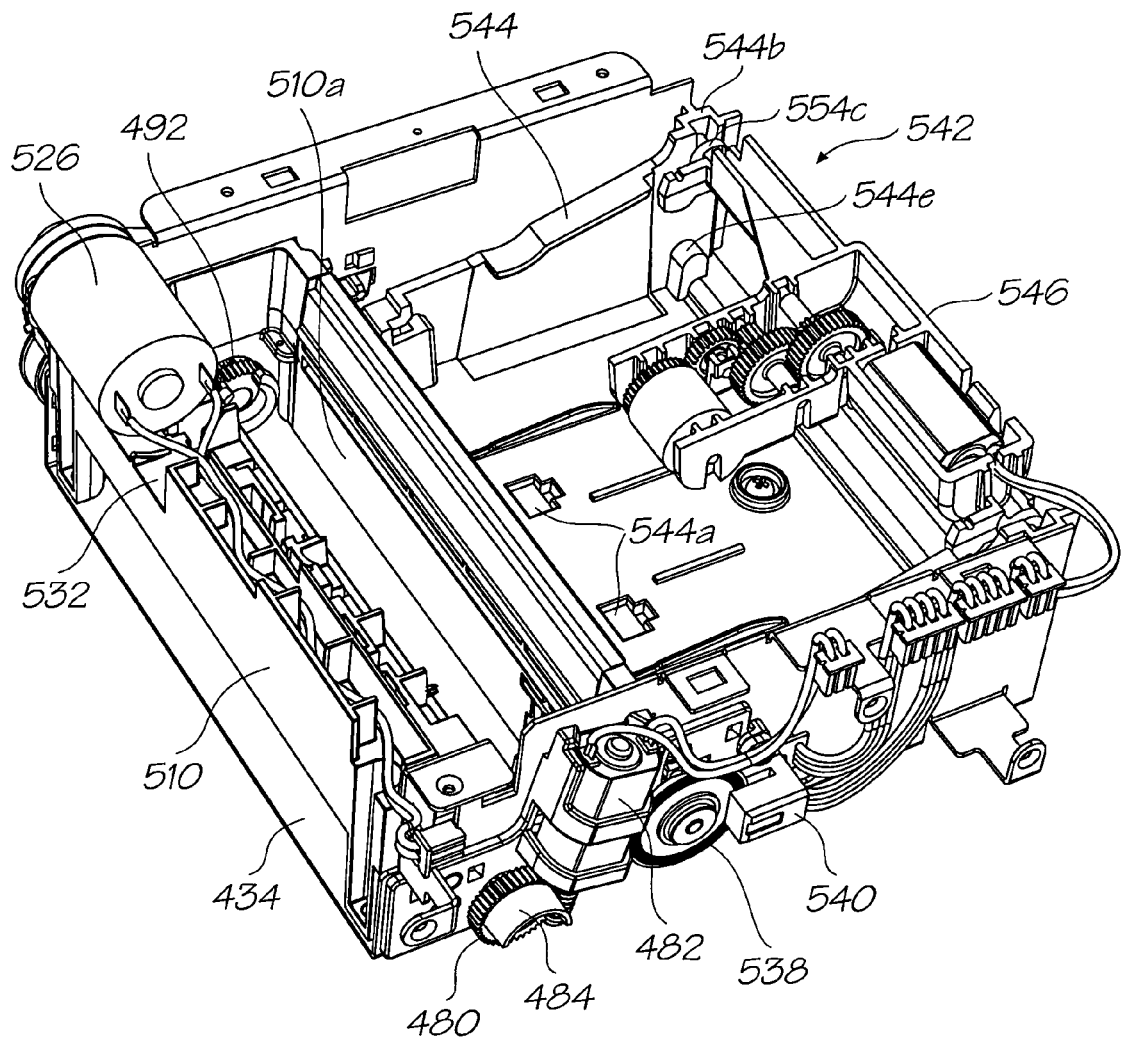
FIG. 24 shows a perspective view of a media pick-up device mounted on the support frame.

An encoder disc 538 is fitted on the second end of the drive roller 454 and an encoder sensor 540 is mounted to the sidewall 434a of the support frame 434 for sensing the position of the encoder disc 538 and therefore the rotational speed of the drive motor 526 (see FIGS. 5 and 24). The illustrated encoder sensor is a U-shaped opto-electric sensor which emits light through holes in the encoder disc as the disc is rotated with the drive roller.

Returning to the assembly, a media pick-up device 542 is then mounted to the support frame 434. The media pick-up device 542 comprises a media cartridge support 544 and a picker assembly 546. The media cartridge support 544 has two hook features 544a which are slid into engagement with two apertures 434c in the base 434b of the support frame 434. A screw is used to secure the media cartridge support 544 to the support frame 434 (see FIG. 24). The media cartridge support 544 is provided with a ridge 544b and details 544c on a base 544d thereof for facilitating the insertion of, and for supporting, the media supply cartridge 600 (see FIG. 6). The media cartridge support is preferably a plastics molding having the ridge and details.

Figure 25A:
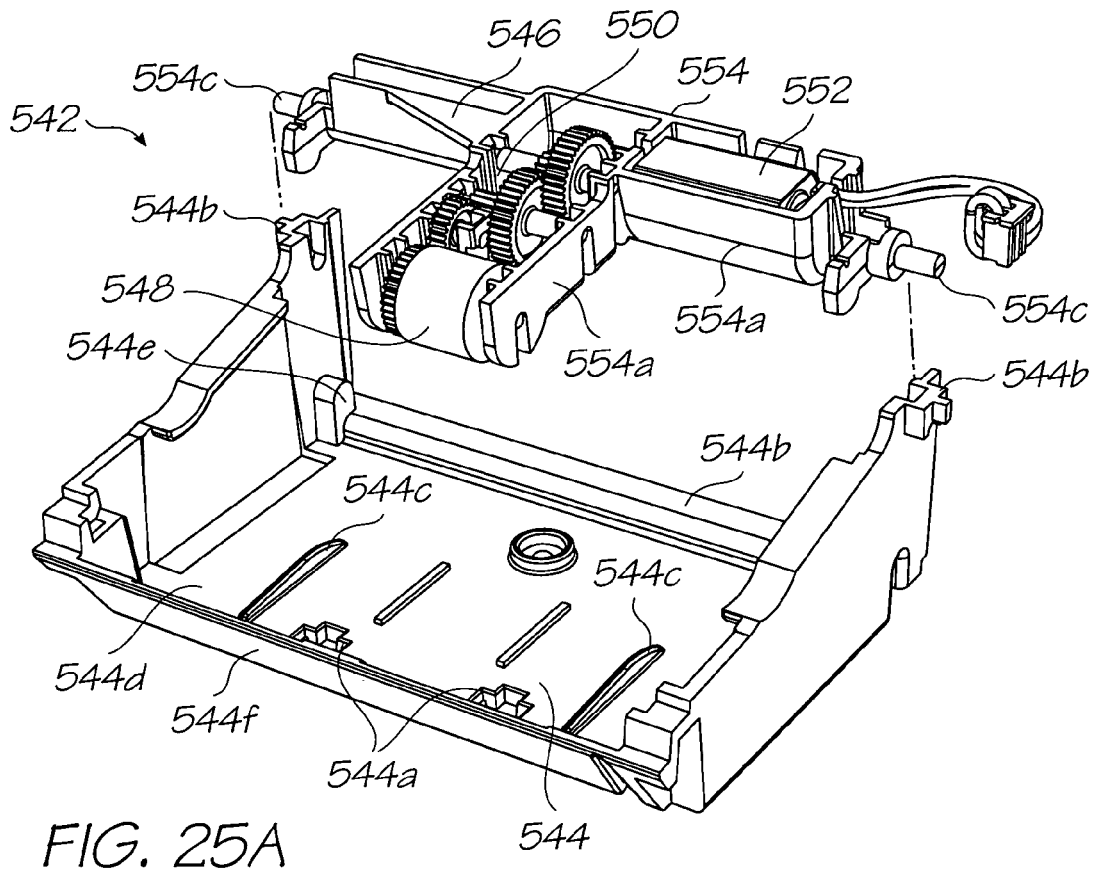
FIGS. 25A and 25B illustrate assembly of the media pick-up device.
Figure 25B:
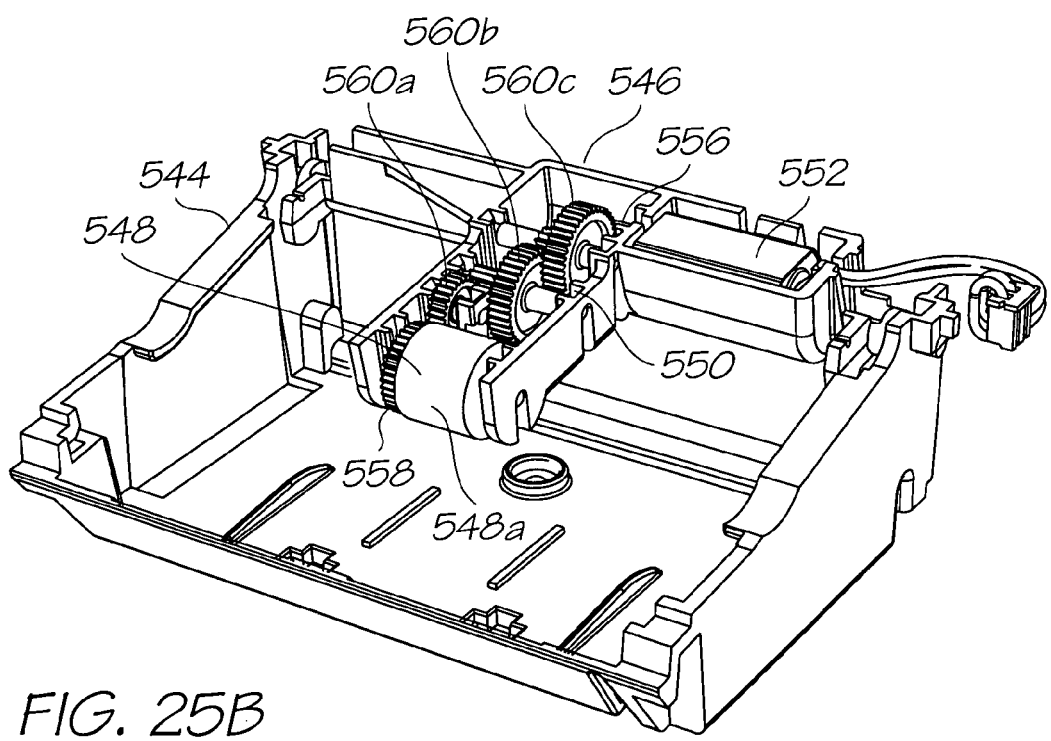

The picker assembly 546 comprises a picker roller 548, associated gear train 550 and picker motor 552 housed in a body 554. Preferably the body 554 is a molding having a base 554a in which the picker motor 552 is mounted and an arm 554b in which the gear train 550 and picker roller 548 are mounted via associated shafts (see FIG. 24). The base 554a of the picker assembly 546 is pivotally mounted to the media cartridge support 544 by engaging (molded) pins 554c of the picker assembly body 554 with pivot details 544b of the media cartridge support 544, as illustrated in FIGS. 25A and 25B. In this way, the picker roller is able to move in and out of contact with the media of the media supply cartridge.

The illustrated gear train 550 has five gears, including a motor gear 556 located on a shaft of the picker motor 552, a picker gear 558 located on a shaft of the picker roller 548 and three intermediate gears 560. With respect to the intermediate gears 560, the gear 560a adjacent (i.e., closest to) the picker gear 558 is a simple gear, whereas the other two intermediate gears 560b and 560c are compound gears. The (compound) gear train 550 is used to transfer the rotational driving force of the picker motor 552 to the picker roller 548 so that the picker roller 548 is rotated at a predetermined rotational speed. The gear train provides a gearing ratio of 50:1 at the picker roller. The picker roller 548 comprises a grip tyre 548a arranged on the roller shaft which grips the sheet media of the inserted media supply cartridge. The grip tyre is preferably made of rubber.

Each of the shafts of the picker and intermediate gears are flex fitted into molded details in the picker assembly body via suitable bearings for allowing rotation of the shafts. It is to be understood that more or less gears may be used in the gear train as is suitable with the rotational force delivered by the picker motor and the rotational speed required for the picker roller 548 to successfully and effectively pick-up the sheet media.

Whilst the rotation of the picker roller 548 is used to perform the picking of the sheet media, the pivoting of the picker assembly 546 is used to consistently position the picker roller 548 in contact with the sheet media as the sheet media is depleted from the inserted media supply cartridge.

In the illustrated embodiment, the picker motor 552 of the pick-up device 542 is located within this pivoting part 546 of the device. Conventionally, picker motors are located external to such a pivoting parts of a media picker. This external positioning means that a powerful, and therefore large, picker motor is required in order to deliver the necessary torque to the roller. The power and size of the picker motor is reduced by locating the picker motor closer to the roller within the pivoting part. For example, a brushed DC motor delivering a maximum torque of 2 mNm (milliNewton meter s) can be used for the picker motor. Whereas a motor capable of delivering about 20% more torque is typically required for an externally positioned motor, due to drive train losses experienced in the extended drive mechanism, i.e., losses due to a longer coupling shaft and at least one or more gear reduction stages on the chassis, in addition to the usual gear coupling stage from pick-up assembly pivot to the picker roller 548.

The mounted position of the pick-up device 542 (see FIG. 6) is configured so that the picker roller 548 picks the sheet media from the inserted media supply cartridge and delivers the leading edge of the sheets to the pinch of the drive and idler rollers, which then take-up the sheets for transport past the printhead of the inserted printhead cartridge.

In order to ensure successful take-up of the sheets, the picker roller 548 is driven at a rotational speed which is less than the rotational speed of the drive roller 454. Typically, the picker roller 548 is driven at a speed about 5% lower than that of the drive roller 454. This mismatch in speed means that the take-up rollers 450,454 pull the sheets faster than the picker roller 548 is able to deliver the sheets. The pivoting action of the picker assembly 546 allows the picker roller 548 to come out of contact with the sheet being pulled by the take-up rollers 450,454 due to the picker motor not be able to match the increase in speed on the picker roller 548.

Depending on the speed of take-up, the picker roller 548 may bounce and drag on the sheets as they are being taken up due to a swinging motion of the picker assembly 546 about the pivot points 544b,554c. This bouncing and dragging generally has a negligible effect on the take-up of the sheets, however it may cause wear on the rubber grip tyre 548a of the picker roller 548 and the bearings of the gear train 550, and velocity spikes in the transport of the sheets, which are undesired due to the possible effect on the print quality.

Figure 26A:
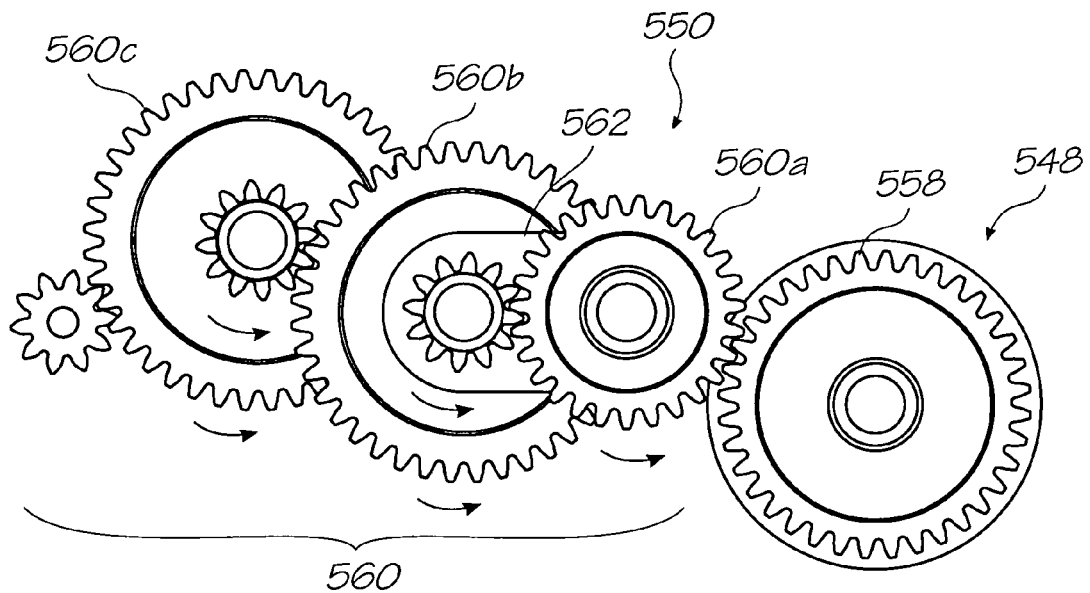
FIGS. 26A and 26B illustrate a disengageble gear assembly of the pick-up device.
Figure 26B:
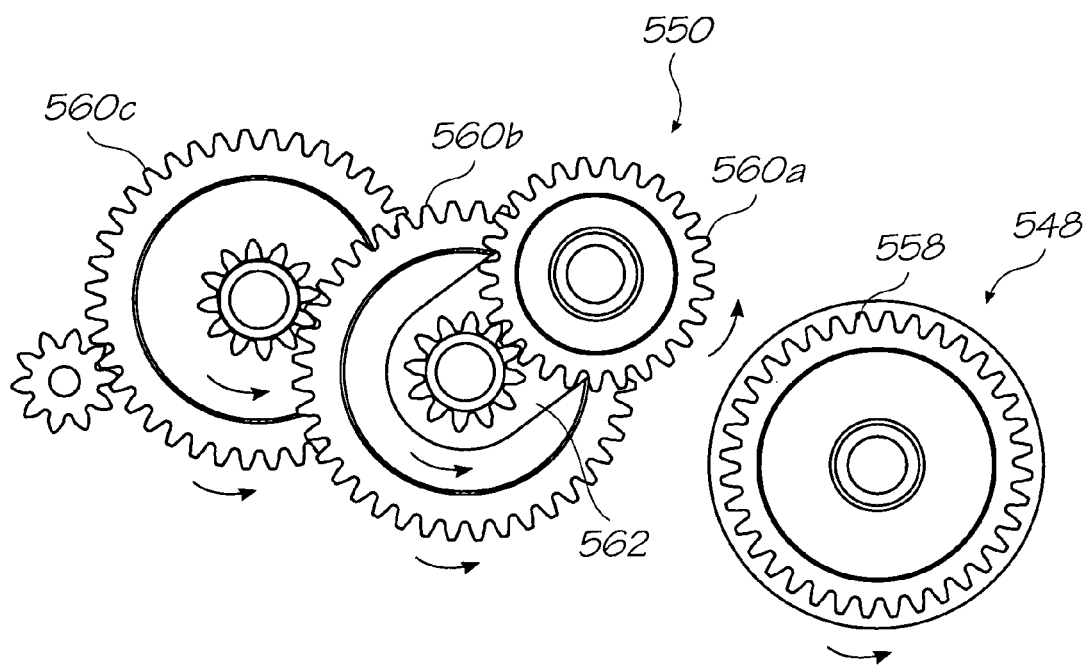

In an alternative embodiment of the picker device illustrated in FIGS. 26A and 26B, the drag of the picker roller 548 on the sheets is reduced by disengaging the picker roller 548 from the picker motor 552 during the take-up of the sheets. This is done by arranging one of the intermediate gears on a pivot arm 562 which pivots the gear out of mesh with the other gears when the rotational speed of the picker roller 548 gear increases at the delivery of the leading edge of a sheet to the take-up rollers 450,454. This disengagement allows the picker roller to effectively free wheel thereby reducing the drag on the sheets. The drag is minimised if the pivoted gear is that closest to the picker roller 548 gear due to the bearing and gear mesh friction of each additional gear not being added to the bearing friction of the picker roller 548. This arrangement is illustrated in FIGS. 26A and 26B, where the pivot arm 562 connects the shaft of the closest gear 560a and the adjacent compound gear 560b.

The pivoted gear 560a is configured to be brought back into engagement with the other gears by the driving torque of the picker motor 552 once the trailing edge of the currently picked sheet has been removed by the take-up rollers 450, 454.

Figure 27:
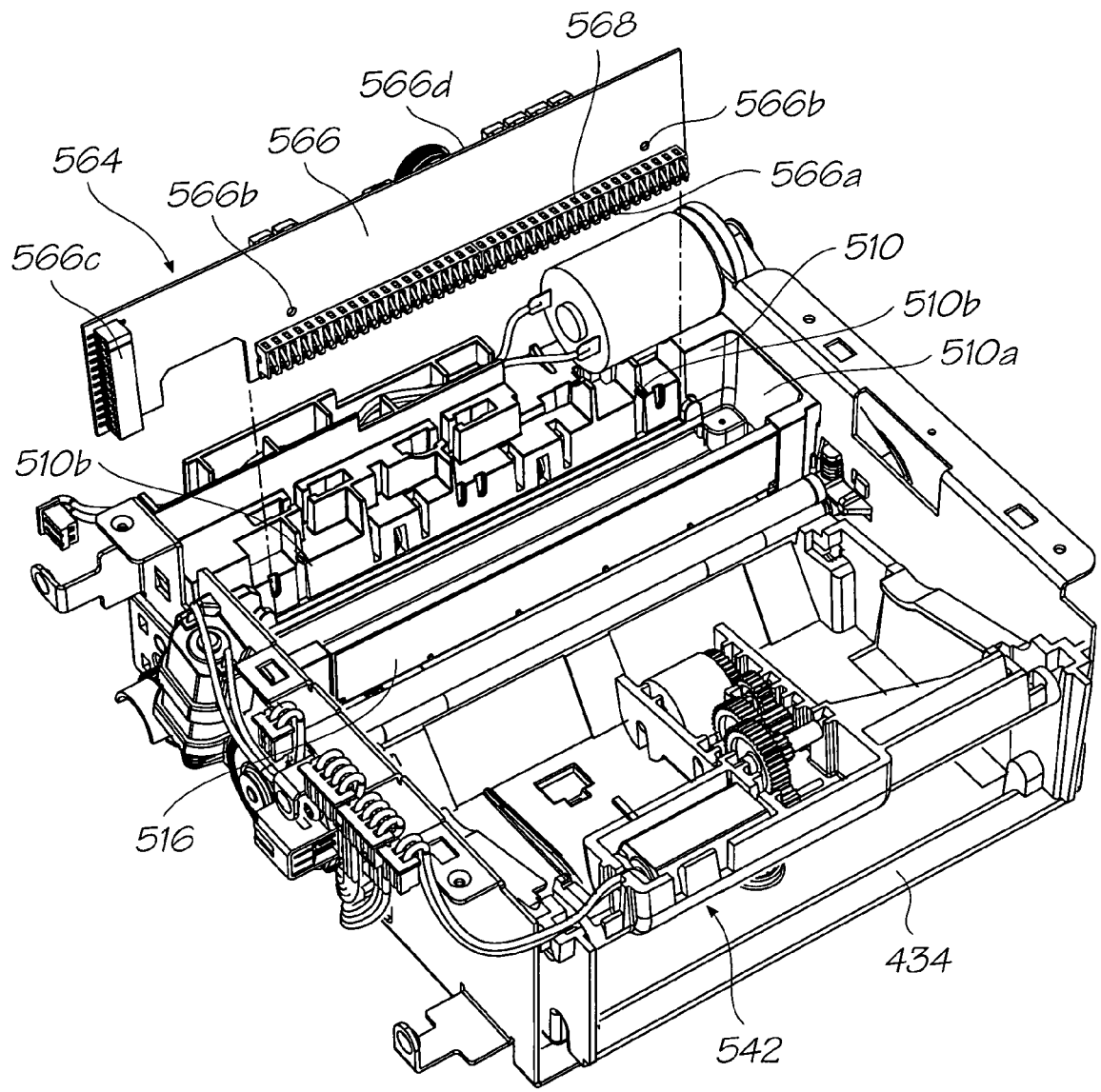
FIG. 27 shows a perspective view illustrating the mounting of a connection interface.
Figure 28:
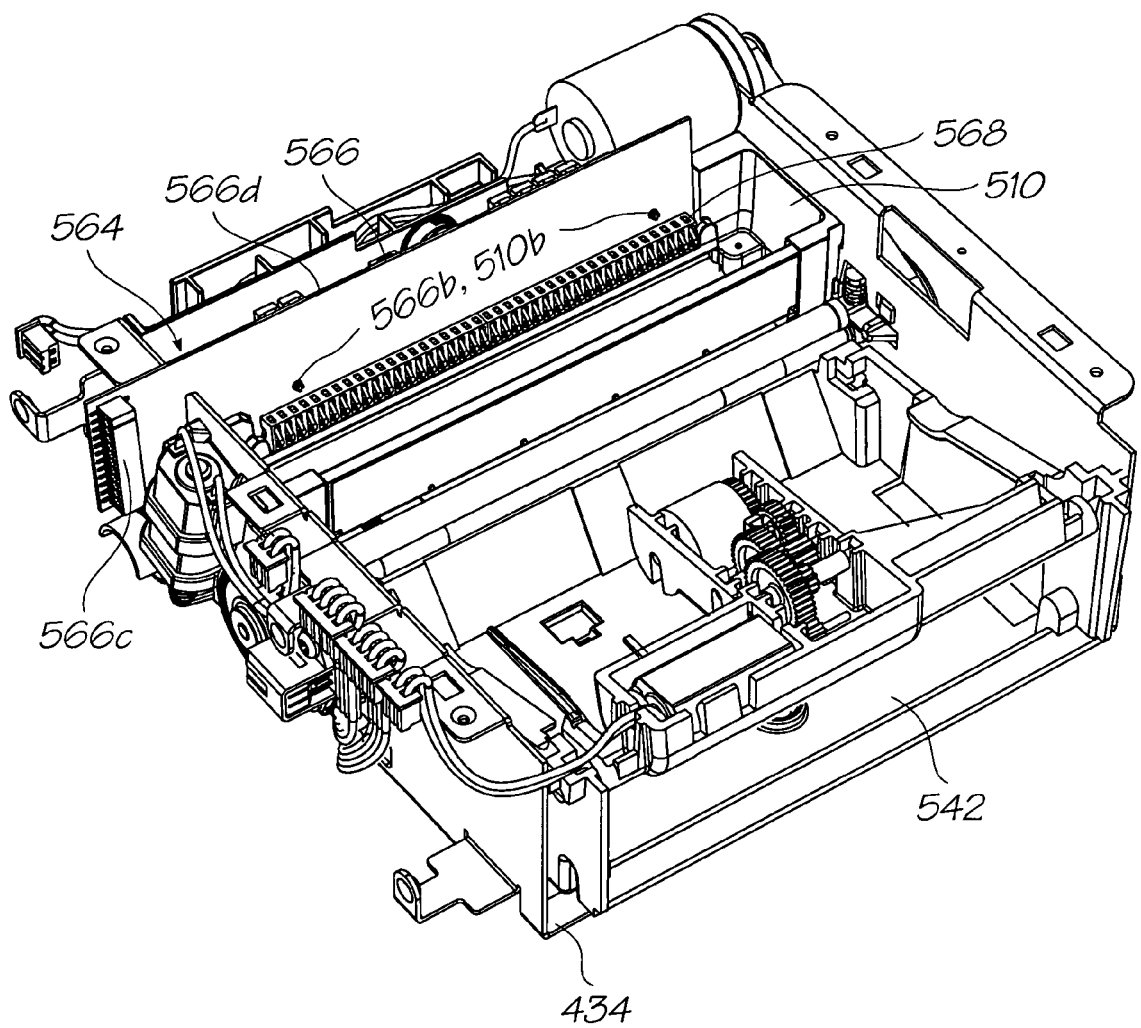
FIG. 28 shows a perspective view illustrating the mounted connection interface.

Returning to the assembly, a connection interface 564 for the printhead cartridge 200 is mounted to the cradle unit 400. The connection interface 564 incorporates a printed circuit board 566 on which power and data connections 568 for the printhead cartridge 200 are arranged. The connection interface board 566 is mounted to the cradle unit 400 by lowering a lower edge 566a of the connection interface board 566 into a slot 510a of the printhead cartridge support 510 for receiving the printhead cartridge 200 (see FIGS. 6 and 27) and engaging holes 566b in the connection interface board 566 with details 510b within the slot 510a (see FIG. 28). The holes 566b are engaged with the details 510b by tilting the connection interface 564 board against a face 510c of the printhead cartridge slot 510a. A tilt angle of up to 1.5 degrees may be accommodated. In this mounted position, the power and data connections 568 are exposed for connection to like connections of the inserted printhead cartridge 200, as illustrated in FIG. 6.

Print control circuitry 570 is then mounted to the body 402 of the cradle unit 400. The print control circuitry 570 incorporates a printed circuit board 572 on which a print controller 573, the power connector 406 and the data connectors 408, 410 are arranged. The print control circuitry board 572 is mounted by engaging a connection header 572a with a complementary connection header 566c of the connection interface 564 at the exterior of one of the sidewalls 434a of the support frame 434 and securing the board 572 with screws or the like to that sidewall (see FIGS. 29 and 30). The mating of the connection headers provides complete connection of power and data to the printhead cartridge-via the connection interface.

In the illustrated embodiment, the connection header 572a of the print control circuitry 570 is a male header and the connection header 566c of the connection interface 564 is a female header, and the connection interface board 566 projects substantially orthogonally to the print control circuitry board. Other arrangements are possible. During this connection, slight movement of the connection interface 564 board is possible on the details 510b within the slot 510a since an upper edge 566d of the connection interface board 566 is free to move. This movement facilitates the mating of the connection headers and accommodates the tilt angle of the connection interface board.

Figure 31:
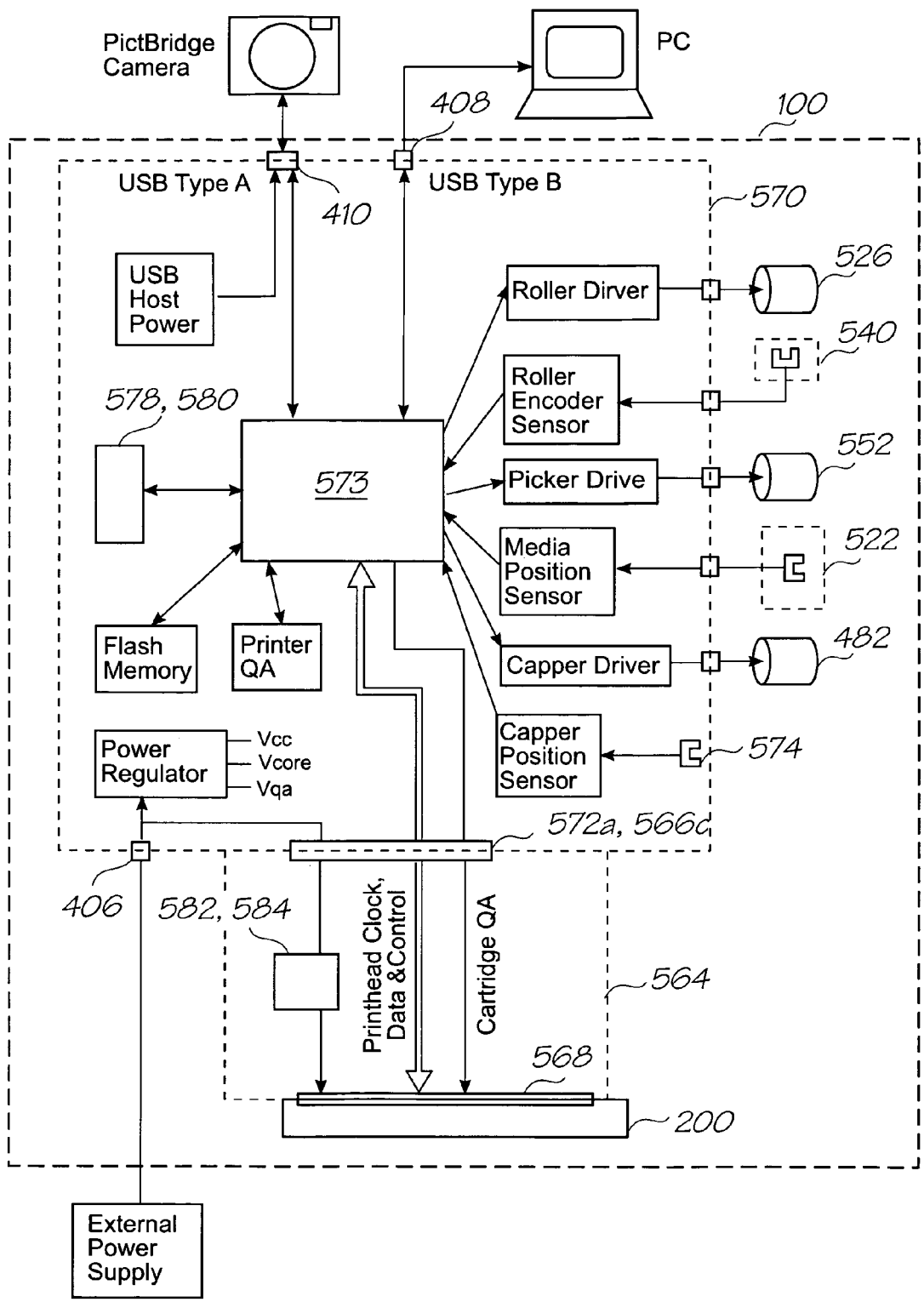
FIG. 31 shows a system diagram of the printer.

FIG. 31 is a system diagram illustrating the connections between the connection interface 564, the print control circuitry 570, the internal components of the cradle unit 400, the printhead cartridge 200, a camera connected at the PictBridge connector 410, a PC connected at the USB connector 408 and an external power supply connected at the power connector 406.

Figure 29:
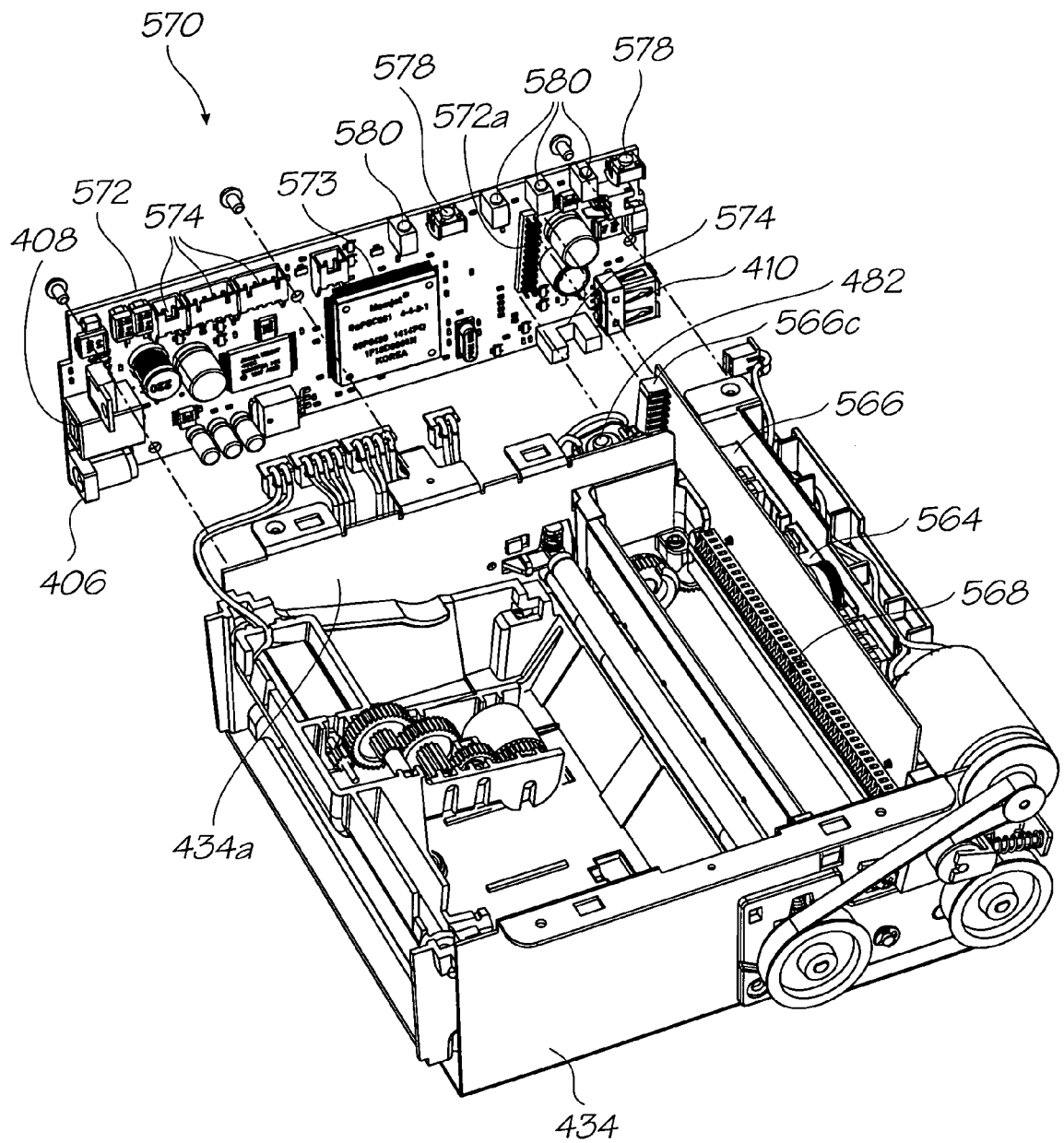
FIG. 29 shows a perspective view illustrating the mounting of print control circuitry.

The print control circuitry board 572 has a capper sensor 574 for sensing a position of the capper (see FIG. 29). The illustrated capper sensor 574 is configured as a U-shaped opto-electric sensor through which the half-cylindrical code feature 484 is able pass as the coded gear 480 is rotated. The capper sensor emits and senses light which is uninterrupted when the code feature is in the (capped) position shown in FIG. 20A and is interrupted when the code feature is in the (uncapped) position shown in FIG. 20B.

The capper sensor 574 is used by the print control circuitry 570 to operate the capper motor 482 to position the capper out and into its capped position. The capper sensor 574 is also used to reposition the eccentricity features 494 of the eccentric gears 492 in order to correct the movement caused by the aforementioned meshing of the coded and motor gears 480 and 508 during assembly.

Figure 30:
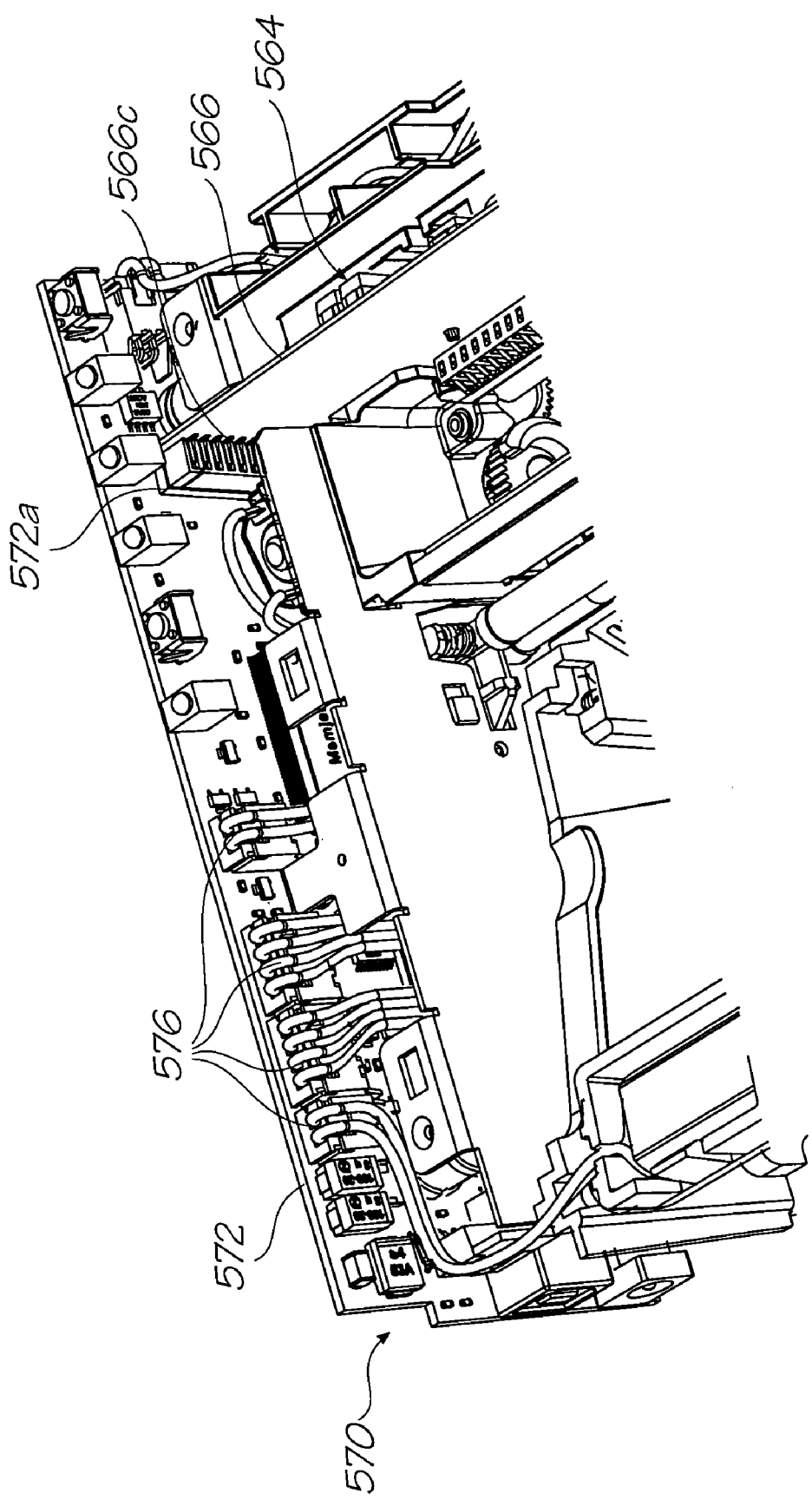
FIG. 30 illustrates various connections of the mounted print control circuitry.

The print control circuitry board 572 also has connection ports 576 for connecting the capper motor 482, the drive motor 526, the encoder sensor 540, the picker motor 552 and the media sensor 522 to the power supply and print control circuitry, as illustrated in FIG. 30.

Various control buttons 578 and indicators 580, such as LEDs, for the function and control of the printer 100 are also incorporated on the print control circuitry board 572. The control buttons 578 include an on/off button and a print function button, where the print function button may be operated by a user to control functioning of the printer 100, such as media feed, reprint, creation of print effects, etc. The indicators 580 may include operation status, print status, printhead cartridge, ink volume, media supply, PC/camera connection, etc, indicators. The buttons and indicators 578,580 are positioned to locate within the control panel 418 when the upper portion 428 of the body 402 is assembled onto the support frame 434 (see FIG. 5).

The complexity of the print control circuitry 570 is minimised by arranging certain circuitry in the connection interface 564. In particular, power regulation circuitry 582 and/or power storage circuitry 584 is integrated in the connection interface 564.

The power regulation circuitry 582 regulates the supply of power from the external (or internal) power supply via the print control circuitry board 572. Such regulation is needed in order to ensure that constant and consistent power is delivered to the ink ejection nozzles of the printhead, thereby maintaining consistent print quality. In particular, the drop ejection of the printhead nozzles is a function of both the supply voltage and the firing pulse width. Each nozzle is configured to eject an ink drop having a volume of about 1.2 picoliters and a velocity of about eight meters per second. If the supply voltage varies significantly, the pulse width needs to be varied to maintain consistent drop quality. Such pulse width variation is undesired and therefore tight regulation is needed.

Figure 32:
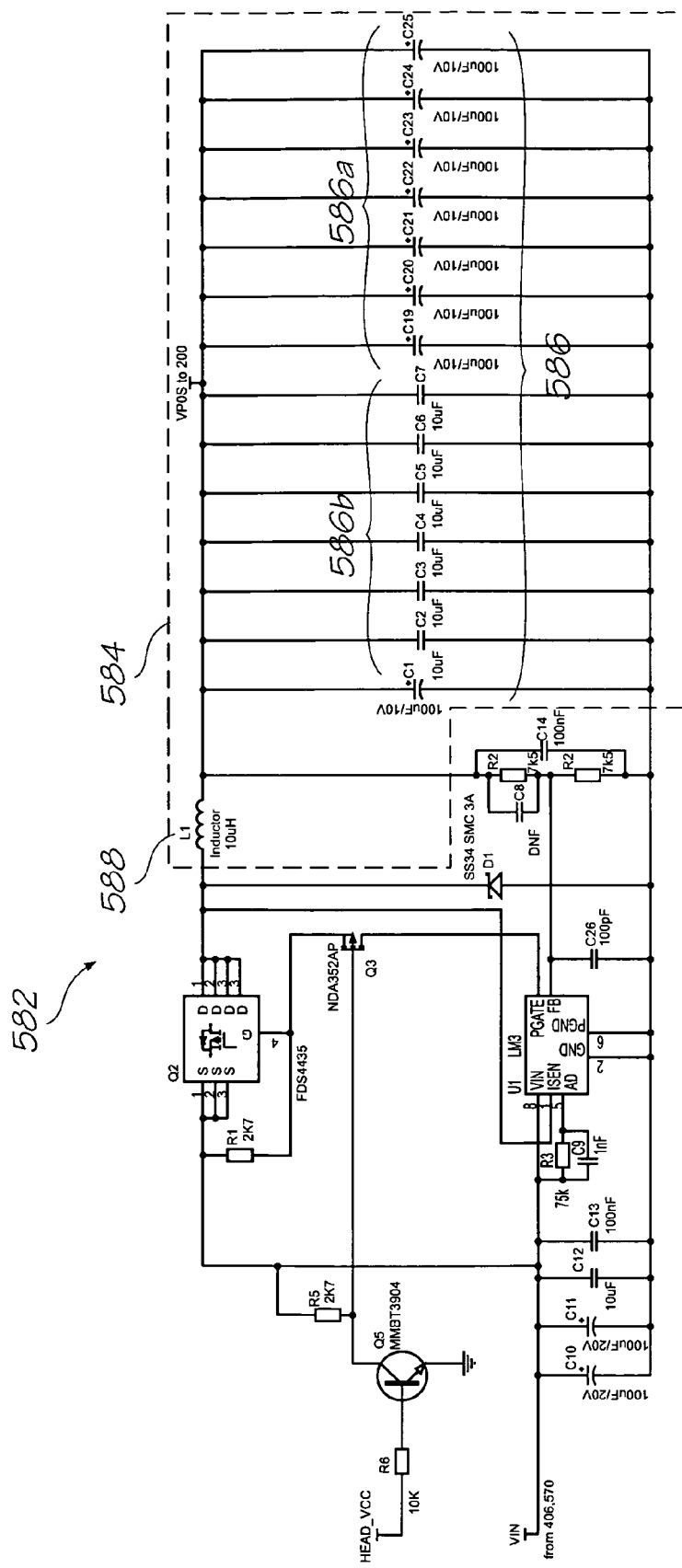
FIG. 32 illustrates an exemplary power regulation and storage circuit.

An exemplary power regulation circuit 582 is illustrated in FIG. 32. The illustrated regulator is a hysteretic regulator based on an LM3485 control chip, and takes an input voltage $V_{IN}$ of 12 Volts at an input current of 2 Amps and outputs a regulated voltage $V_{POS}$ of up to 5.5 Volts at a regulated current of 3.5 Amps to the inserted printhead. The maximum total variation in the output voltage under all load conditions is 100 millivolts. This variation occurs due to load transients on the output capacitors and the ripple due to the hysteretic control, and is not significant enough to adversely affect the print quality.

The power storage circuitry 584 stores at least some of the power supplied from the external (or internal) power supply via the print control circuitry board 572. Such storage is desired to account for potential power shortages during operation of the printhead, thereby maintaining consistent print quality. Power storage also takes account for brief peaks in the nozzle current consumption which is dependent upon the image density and print speed of a printing operation.

An exemplary power storage circuit 584 is illustrated in FIG. 32 as part of the regulator 582. A number of output capacitors 586 and an inductor 588 are provided to store some of the energy supplied to the connection interface 564. In the illustrated storage circuitry 584, bulk energy storage of about 12 milliJoules is provided by eight 100 microFarad electrolytic (low ESR tantalum) capacitors 586a, energy storage of about 900 microJoules for fast load transients is provided by six 10 microFarad ceramic capacitors 586b and about 60 microJoules of energy is stored by the inductor 588, which is a 10 microHenry inductor. Further energy storage may also be provided in the printhead itself.

With the internal components of the cradle unit 400 assembled and the various connections made, the assembly is encased with the upper and lower portions 428 and 430 of the body 402, by securing the upper and lower portions to the support frame 434 with screws or the like, and the lid 404 is hingedly attached to the upper portion 428.

Figure 33:
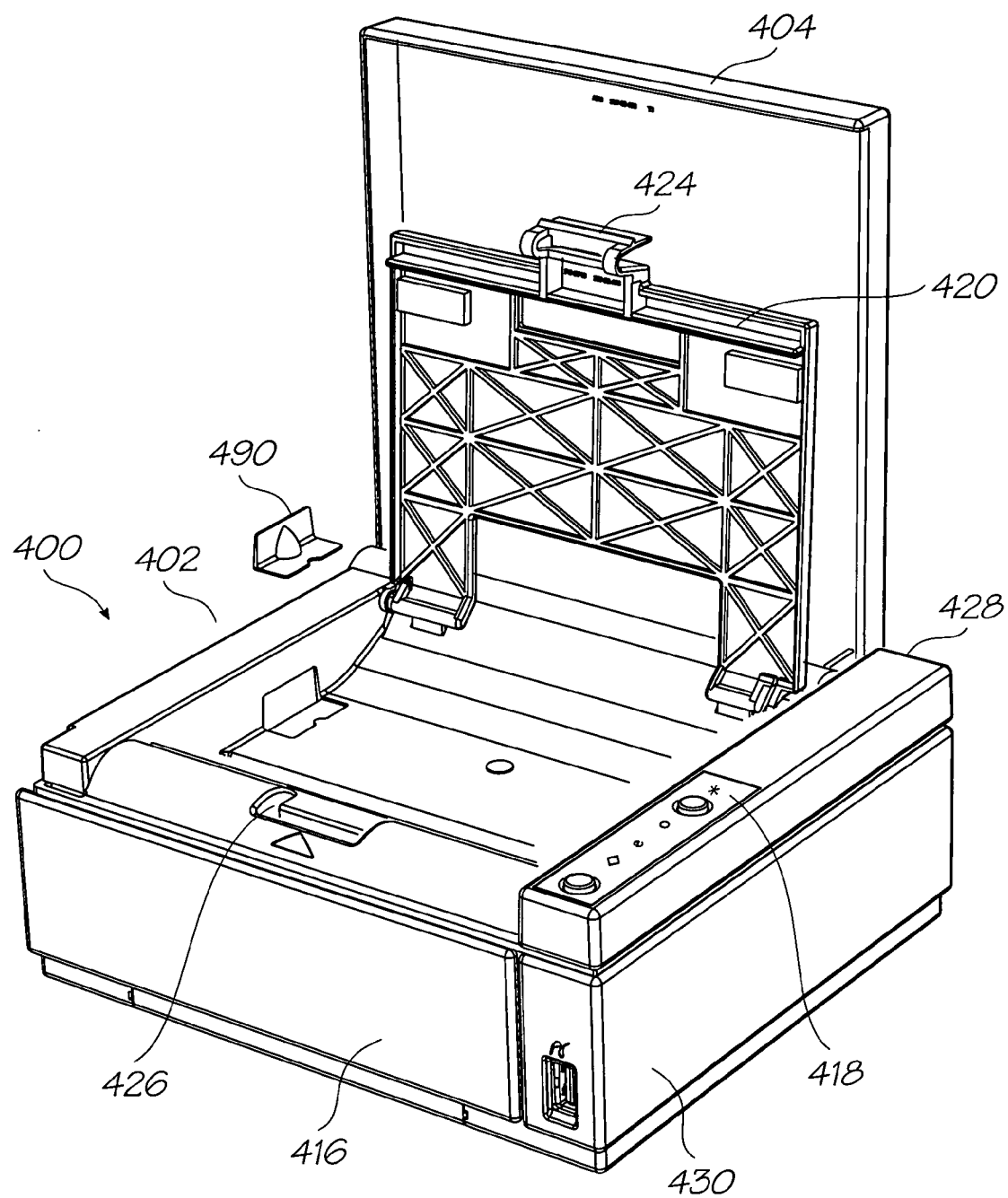
FIG. 33 shows a perspective view illustrating mounting of a key feature.
Figure 34:
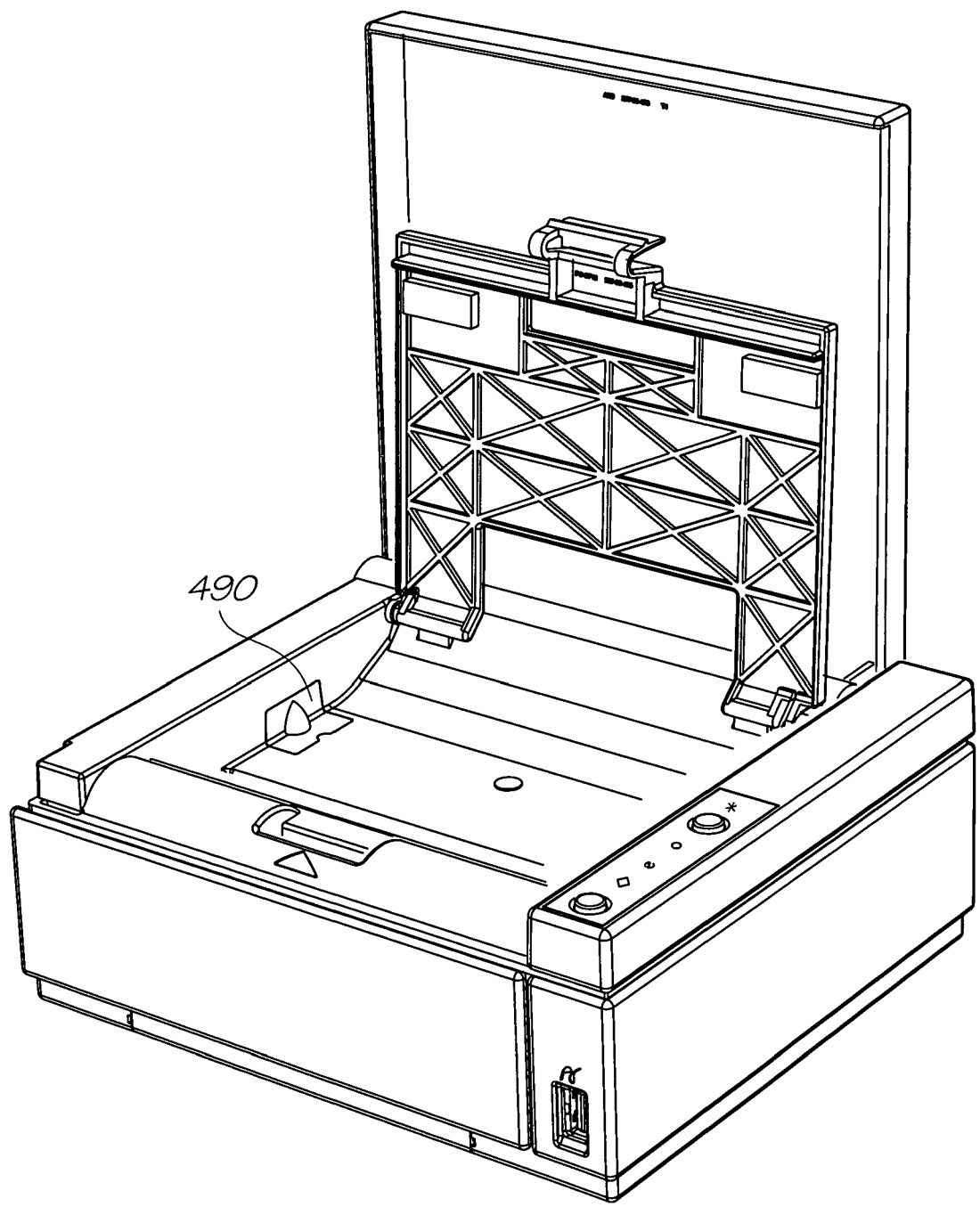
FIG. 34 shows a perspective view illustrating the mounted key feature.

In order to ensure the use of a printhead cartridge which is properly configured to operate with the cradle unit 400, it is possible to arrange a key feature 490 on the cradle unit 400, as illustrated in FIGS. 33 and 34, which only allows the insertion of a printhead cartridge having a complementary key feature. Such 'branding' of the cradle unit 400 and printhead cartridge can be carried out after manufacture.

Media Supply Cartridge

Figure 35:
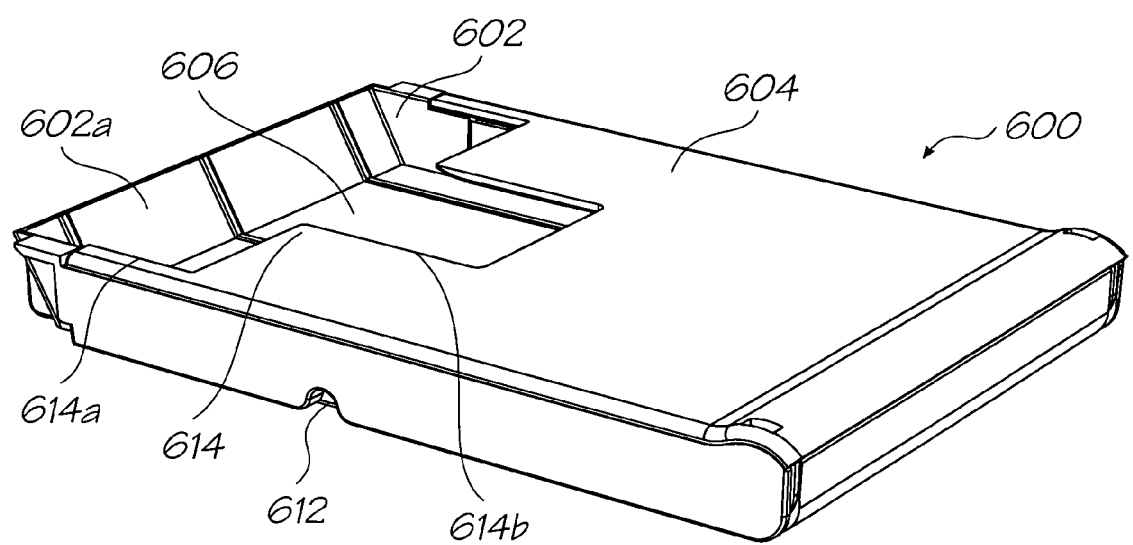
FIG. 35 shows a perspective view of the media supply cartridge.

The media supply cartridge 600 is an assembly of a sheet media support 602 and a hinged lid 604, as illustrated in FIGS. 5 and 35. The sheet media support 602 is dimensioned to support a stack of sheet media on its base 606, such as 200 sheets of 4 inch by 6 inch photo paper. The lid 606 is hinged on the media support 602 so as to facilitate filling and re-refilling of the media stack. The support and lid are preferably plastic moldings or pressed metal.

A spring 608 is located within the media support 602 for maintaining a position of the stack within the media support. In the illustrated embodiment, the spring 608 is located on one sidewall 610 of the media support 602 (see FIG. 5), however other arrangements or the use of more than one spring or other biasing means is possible.

The media supply cartridge 600 is inserted into the media supply cartridge slot 412 of the cradle unit 400 so as to locate in the media supply cartridge support 544 of the pick-up device 542. The media supply cartridge 600 is held in place by the engagement of recesses 612 in the cartridge 600 with (molded) details 544e of the media cartridge support 544 (see FIGS. 1 and 35).

As described earlier, the ridge and details 544b and 544c of the media cartridge support 544 facilitate the insertion of the media supply cartridge 600. A taper of the details 544c in conjunction with the ridge 544b result in the media supply cartridge 600 being held at an angle with respect to the base 544d of the cartridge support 544 (see FIG. 6). This angle on the sheet media, facilitates the pick-up of the sheets by the picker roller 548.

The lid 604 is formed to have nested openings 614. The larger opening 614a allows unobstructed withdrawal of the sheet media from the media supply cartridge, whilst the smaller opening 614b allows unobstructed access to the sheet media by the picker roller 548 of the pick-up device 542 when the media supply cartridge 600 is inserted in the media supply cartridge slot 412 of the cradle unit 400.

The delivery of the sheet media occurs past an inclined front face 602a of the sheet media support 602 which is supported by a similarly inclined front face 544f of the media cartridge support 544 (see FIG. 6). The angle of the incline is configured to assist in the picking of the sheets as the sheets are depleted from the stack and the stack height decreases. A stepped region 616 is arranged in the base 606 on the sheet media support 602 to further assist in the picking of the last few sheets of the stack.

This assistance occurs when the picker roller 548 contacts and presses against the remaining sheets causing the sheets to slightly buckle about the stepped region 616. The buckling causes the leading edge of the sheets to raise slightly, making it easier for the sheets to be driven up the inclined face 602a to the nip of the take-up rollers 450,454 by the picker roller 548. Once the stack has been depleted, the media supply cartridge 600 can be removed from the printer 100 and replaced with a new cartridge or refilled for reinsertion.

The number of sheets remaining in a media supply cartridge is monitored by the print control circuitry 570 of the cradle unit 400. This is done by storing a count of the number of sheets fed from the cartridge as sensed by the media sensor 522 of the media guide 516 and/or storing a count of the number of sheets/pages that have been printed.

Alternatively, or in addition, if the media sensor 522 of the media guide 516 senses that a sheet has not been picked by the pick-up device 542 from the media cartridge 600, by not sensing the leading edge of the sheet, the print controller 570 may, for example, cause a media supply indicator 580 of the control panel 418 to operate and/or display of a media out message on the PC or digital camera connected to the printer 100, which indicates to a user that either the media supply cartridge is depleted, the media supply cartridge has not been inserted or the media has not been successfully picked from the cartridge and allows subsequent correction by the user.

Further, media jams can be detected by the media sensor 522 by sensing that the leading edge of a sheet has passed the sensor 522 but not the trailing edge. In such a case, the print controller 570 can respond by stopping printing and operating the drive roller 454 in the reverse direction to remove the jammed sheet. If this does not work, or alternatively, the print controller may, for example, cause a media jam indicator 580 to operate and/or display of a media jam message on the PC or digital camera connected to the printer 100, which indicates to a user that a media jam has occurred and allows subsequent correction by the user.

While the present invention has been illustrated and described with reference to exemplary embodiments thereof, various modifications will be apparent to and might readily be made by those skilled in the art without departing from the scope and spirit of the present invention. Accordingly, it is not intended that the scope of the claims appended hereto be limited to the description as set forth herein, but, rather, that the claims be broadly construed.

The invention claimed is:

1. A cradle unit for a printhead cartridge, the cradle unit comprising:
   an interface at which a printhead cartridge is removably engageable with the cradle unit, the interface comprising connections for connecting the printhead cartridge with a power supply which is remote from the interface and print control circuitry of the cradle unit; and a power regulation circuit incorporated in the interface for regulating supply of power from the power supply to the printhead cartridge, wherein the interface incorporates a first printed circuit board, the connections and power regulation circuit being arranged on the first printed circuit board, and the print control circuitry is incorporated on a second printed circuit board, the first and second printed circuit boards have complementary connectors which cooperate to provide the connection or the printhead cartridge and print control circuitry, the complementary connectors being arranged so that the first printed circuit board is able to pivot with respect to the second printed circuit board.

2. A cradle unit according to claim 1, wherein the power regulation circuit is configured to regulate the supply of power from the power supply so that ink ejection nozzles of a printhead incorporated in the printhead cartridge receive substantially constant power.

3. A cradle unit according to claim 1, wherein the first printed circuit board is arranged so as to substantially orthogonally project from the second printed circuit through the cooperation of the complementary connectors.

4. A cradle unit according to claim 1, wherein the power regulation circuit is configured to output a regulated voltage up to 5.5 Volts from a supply of 12 Volts from the power supply.

5. A cradle unit according to claim 4, wherein the power regulation circuit is configured to output a regulated current of 3.5 Amps from a supply of 2 Amps from the power supply.

6. A cradle unit according to claim 4, wherein the power regulation circuit is configured to output the regulated voltage with a maximum variation of 100 milliVolts.

7. A cradle unit according to claim 1, wherein the power regulation circuit incorporates a power storage circuit for storing at least some of the power being supplied to the printhead cartridge from the power supply.

8. A cradle unit according to claim 7, wherein the power storage circuit includes a plurality of capacitors for storing said power.

9. A cradle unit according to claim 8, wherein the capacitors include electrolytic and ceramic capacitors.

10. A cradle unit according to claim 9, wherein the electrolytic capacitors are 100 microFarad capacitors.

11. A cradle unit according to claim 9, wherein the electrolytic capacitors are tantalum capacitors.

12. A cradle unit according to claim 9, wherein eight of the electrolytic capacitors are arranged in parallel to store about 12 milliJoules of energy.

13. A cradle unit according to claim 9, wherein the ceramic capacitors are 10 microFarad capacitors.

14. A cradle unit according to claim 9, wherein six of the ceramic capacitors are arranged in parallel to store about 900 microJoules of energy.

15. A cradle unit according to claim 8, wherein the power storage circuit further includes an inductor for storing some of said power.

16. A cradle unit according to claim 15, wherein the inductor is a 10 microHenry inductor.

* * * * *